(12) United States Patent
Toyama et al.

(10) Patent No.: US 8,917,554 B2
(45) Date of Patent: Dec. 23, 2014

(54) BACK-BIASING WORD LINE SWITCH TRANSISTORS

(75) Inventors: Fumiaki Toyama, San Jose, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 410 days.

(21) Appl. No.: 13/282,309

(22) Filed: Oct. 26, 2011

(65) Prior Publication Data

US 2013/0107627 A1    May 2, 2013

(51) Int. Cl.
| | | |
|---|---|---|
| *G11C 16/06* | (2006.01) | |
| *G11C 16/08* | (2006.01) | |
| *G11C 16/10* | (2006.01) | |
| *G11C 16/14* | (2006.01) | |
| *G11C 16/16* | (2006.01) | |
| *G11C 16/04* | (2006.01) | |

(52) U.S. Cl.
CPC ............ *G11C 16/0483* (2013.01); *G11C 16/08* (2013.01)
USPC ............ 365/185.18; 365/185.17; 365/185.23; 365/185.27; 365/185.29; 365/185.11

(58) Field of Classification Search
CPC .... G11C 16/0483; G11C 16/06; G11C 16/08; G11C 16/10; G11C 16/12; G11C 16/14; G11C 16/16
USPC ............ 365/185.17, 185.18, 185.23, 185.27, 365/185.29, 185.11
See application file for complete search history.

(56) References Cited

U.S. PATENT DOCUMENTS

| | | | |
|---|---|---|---|
| 5,295,095 A | 3/1994 | Josephson | |
| 5,886,942 A | 3/1999 | Akita | |
| 6,791,878 B2 * | 9/2004 | Jeong | 365/185.17 |
| 7,095,656 B2 * | 8/2006 | Lee | 365/185.29 |
| 7,411,824 B2 * | 8/2008 | Shibata et al. | 365/185.11 |
| 2005/0243602 A1 * | 11/2005 | Umezawa | 365/185.11 |
| 2005/0265109 A1 | 12/2005 | Goda et al. | |
| 2007/0014152 A1 * | 1/2007 | Shibata et al. | 365/185.11 |
| 2009/0279359 A1 | 11/2009 | Goda et al. | |
| 2010/0002522 A1 | 1/2010 | Park | |
| 2010/0202214 A1 | 8/2010 | Yip | |
| 2010/0315888 A1 | 12/2010 | Sato | |
| 2011/0096602 A1 * | 4/2011 | Kim et al. | 365/185.11 |

OTHER PUBLICATIONS

International Search Report and Written Opinion of the International Searching Authority dated Feb. 13, 2013, PCT International Application No. PCT/US2012/061421, filed Oct. 26, 2012, 9 pages.

* cited by examiner

*Primary Examiner* — J. H. Hur
(74) *Attorney, Agent, or Firm* — Vierra Magen Marcus LLP

(57) ABSTRACT

Word line switch transistors in a well in a substrate may be back biased. A memory array having non-volatile storage devices may be in a separate well in the substrate. The well of the word line switch transistors may be biased separately from the well of the non-volatile storage devices. Word line switch transistors may be back-biased during an erase operation. A first voltage may be applied to a first terminal of word line switch transistors that are coupled to blocks selected for erase. The first voltage may be applied to a first terminal of word line switch transistors that are coupled to blocks that are not selected for erase. The first voltage is passed to word lines in selected blocks, but is not passed to word lines in unselected blocks.

11 Claims, 19 Drawing Sheets

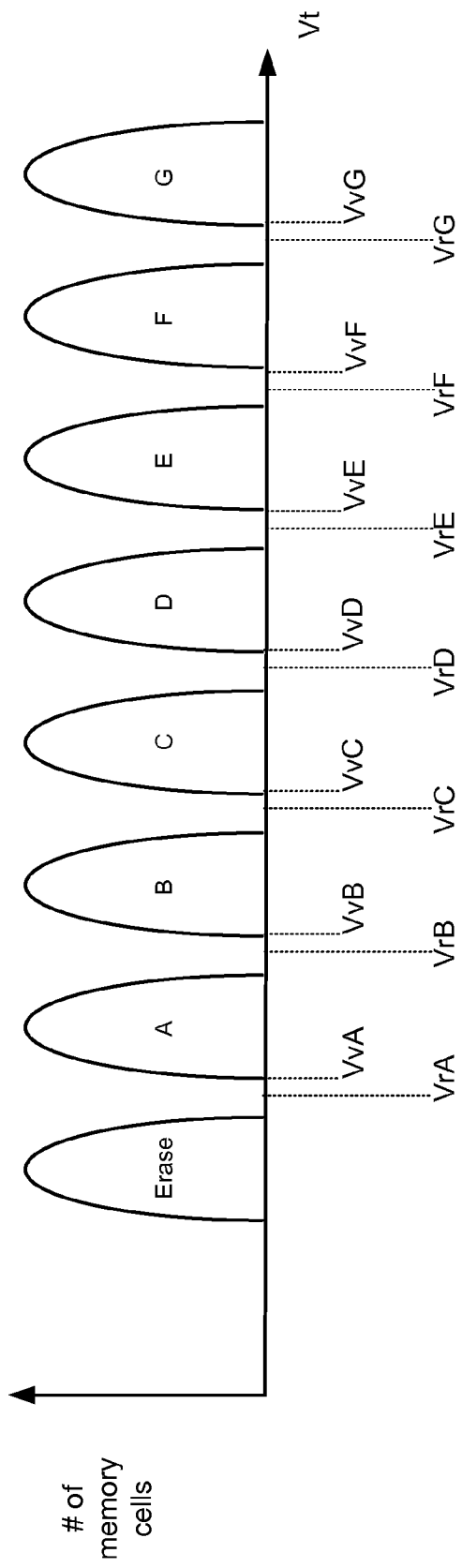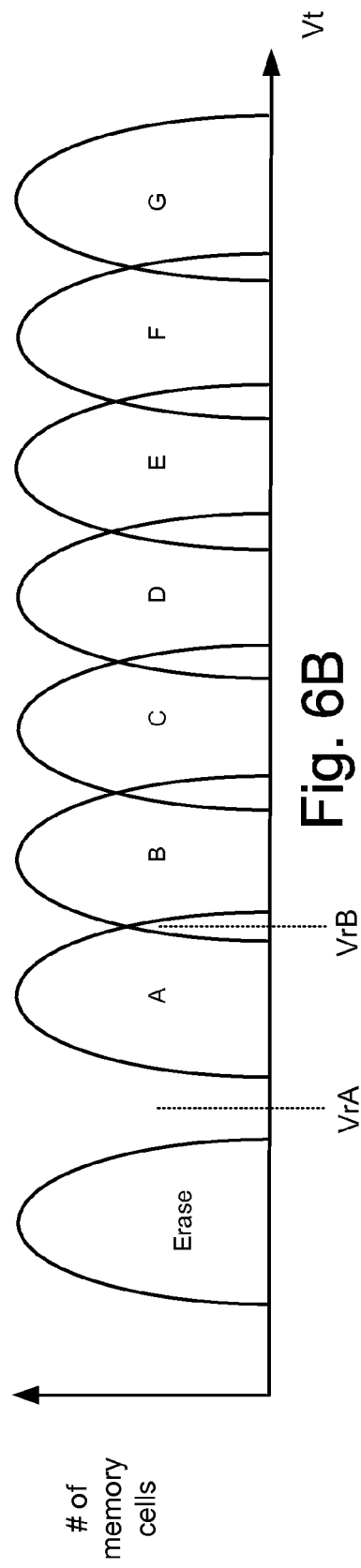

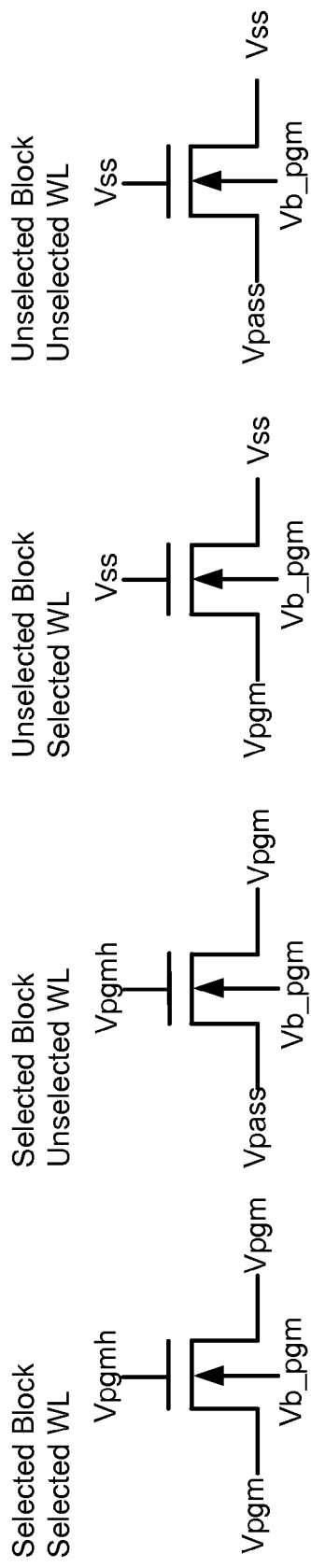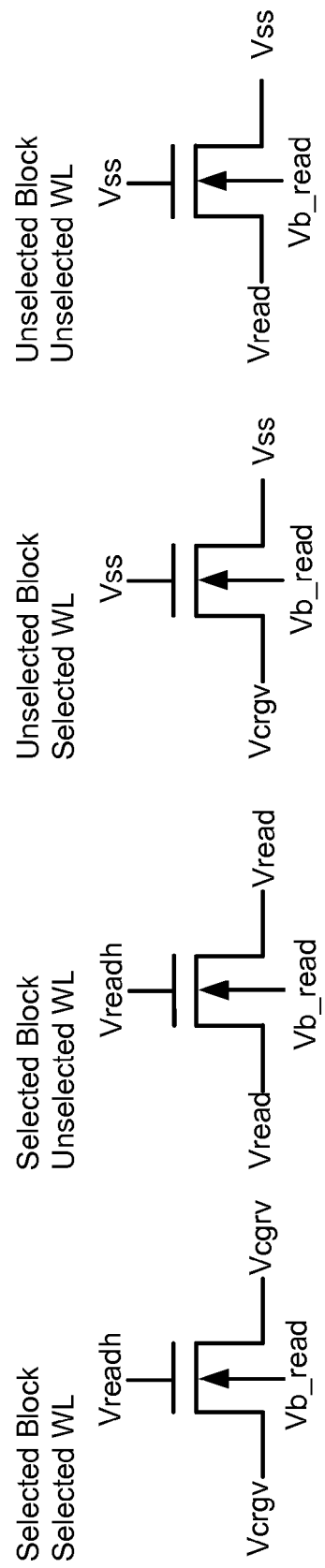

BACK-BIASING WORD LINE SWITCH TRANSISTORS

BACKGROUND

The present disclosure relates to non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed.

For some architectures, thousands of memory cells can be programmed or read at the same time. For example, with a NAND architecture the control gates of thousands of memory cells may be connected together into what is commonly referred to as a word line. Thus, by applying a program voltage to the word line, thousands of memory cells can be programmed at a time. Likewise, by applying a read voltage to the word line, thousands of memory cells can be read at a time.

A memory array may have many word lines, each used as a control line for a different set of memory cells. For some architectures, programming or reading is performed on one word line at a time. Typically, this is referred to as the selected word line. Thus, a programming voltage may be applied to the selected word line, at that same time another voltage that does not program memory cells is applied to unselected word lines. For reading, a read compare voltage may be applied to the selected word line, at the same time that a read pass voltage is applied to the unselected word lines.

One technique for applying the necessary voltages to the word lines is through a word line switch transistor that is connected to each word line. For some techniques, in order to turn on the word line switch transistor to transfer the program voltage to the word line, the gate of the word line switch transistor needs to be at least the program voltage plus the transistor's threshold voltage. Program voltages may be quite large, thus the needed gate voltage is even larger. These large voltages are typically provided by charge pumps in a peripheral region of the memory device. However, generating larger voltages may require a larger charge pump, which takes up more chip real estate and increases complexity.

BRIEF DESCRIPTION OF THE DRAWINGS

FIG. 6A depicts an example set of Vt distributions.

FIG. 6B depicts an example set of Vt distributions.

FIG. 11A, FIG. 11B, FIG. 11C, and FIG. 11D show example biases that may be applied to the WL switch transistor during programming, in accordance with one embodiment.

FIG. 12A, FIG. 12B, FIG. 12C, and FIG. 12D show example biases that may be applied to the WL switch transistor during programming, in accordance with one embodiment.

DETAILED DESCRIPTION

The present disclosure provides methods and devices for operating non-volatile storage. Back biasing word line switch transistors is disclosed. Back biasing is also referred to herein as body biasing. One embodiment includes word line switch transistors that are in a well in a substrate. A memory array having non-volatile storage devices may be in a separate well in the substrate. The well in which the word line switch transistors reside may be biased separately from the well of the non-volatile storage devices. While programming the non-volatile storage devices, a negative voltage (e.g., a back bias) may be applied to the well in which the word line switch transistors reside. This may reduce the voltage that needs to be applied to the gate of a WL switch transistor to pass the program voltage to the selected word line. Therefore, charge pumps can be made smaller, since the maximum voltage they need to generate is smaller.

In one embodiment, applying a negative voltage to the well in which the word line switch transistors reside allows a negative read compare voltage to be used during read operations. By allowing negative read compare voltages, memory cells may be programmed to negative threshold voltages. Note that for some conventional devices, memory cells are erased to negative threshold voltages, but programmed to positive threshold voltages. Allowing programmed states with negative threshold voltages increases the range of allowed threshold voltages. Therefore, the spaces between programmed states may be wider, which may improve read margins.

In one embodiment, a negative voltage is applied during an erase operation to the well in which the word line switch transistors reside. This may reduce or eliminate source-drain punch through of word line switch transistors for unselected blocks.

Figure 1A:
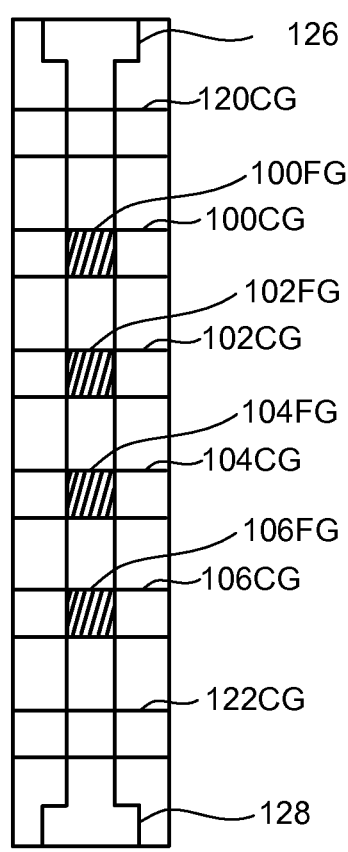
FIG. 1A is a top view of a NAND string.
Figure 1B:
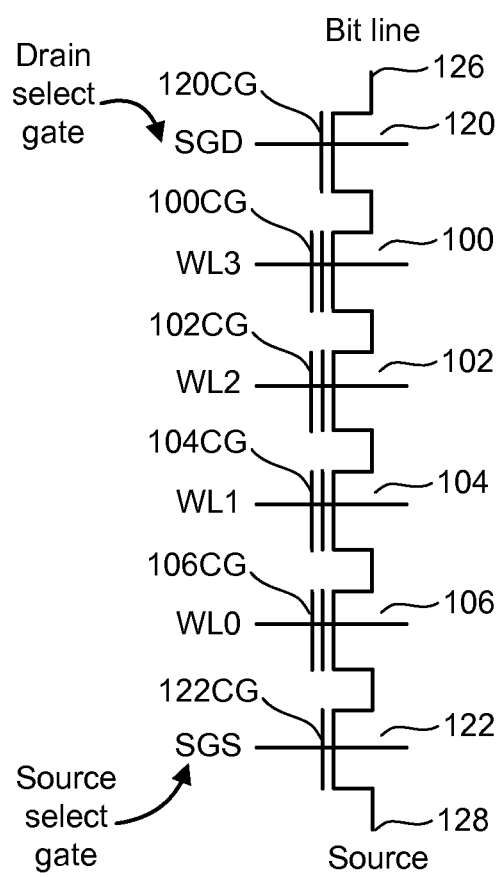
FIG. 1B is an equivalent circuit diagram of the NAND string of FIG. 1A.

One example of a memory system suitable for implementing embodiments uses a NAND flash memory structure, which includes arranging multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1A and 1B. Select gate 120 is connected to select line SGD. Select gate 122 is connected to select line SGS.

Figure 2:
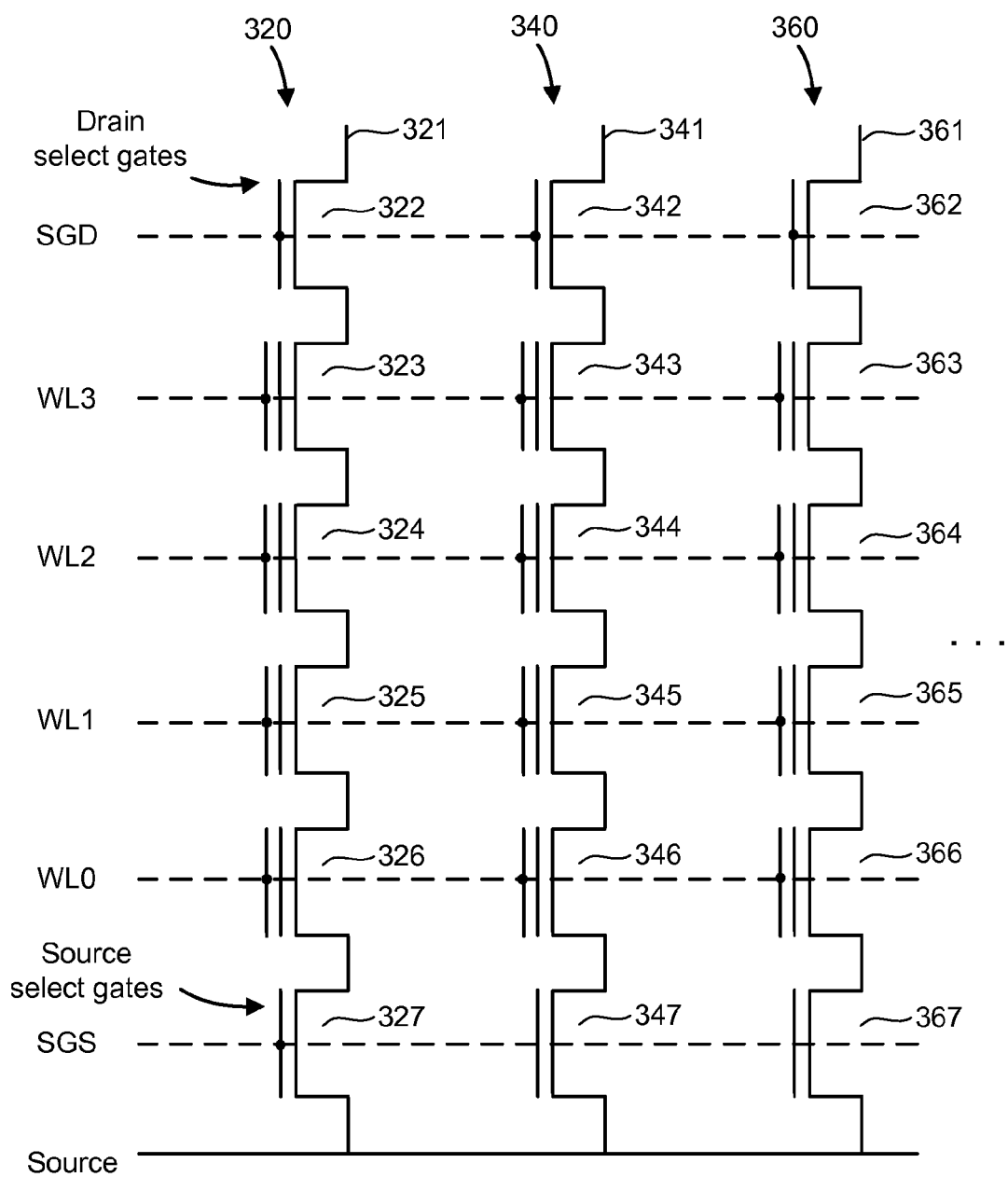
FIG. 2 is a circuit diagram depicting three NAND strings.

FIG. 2 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

Figure 3A:
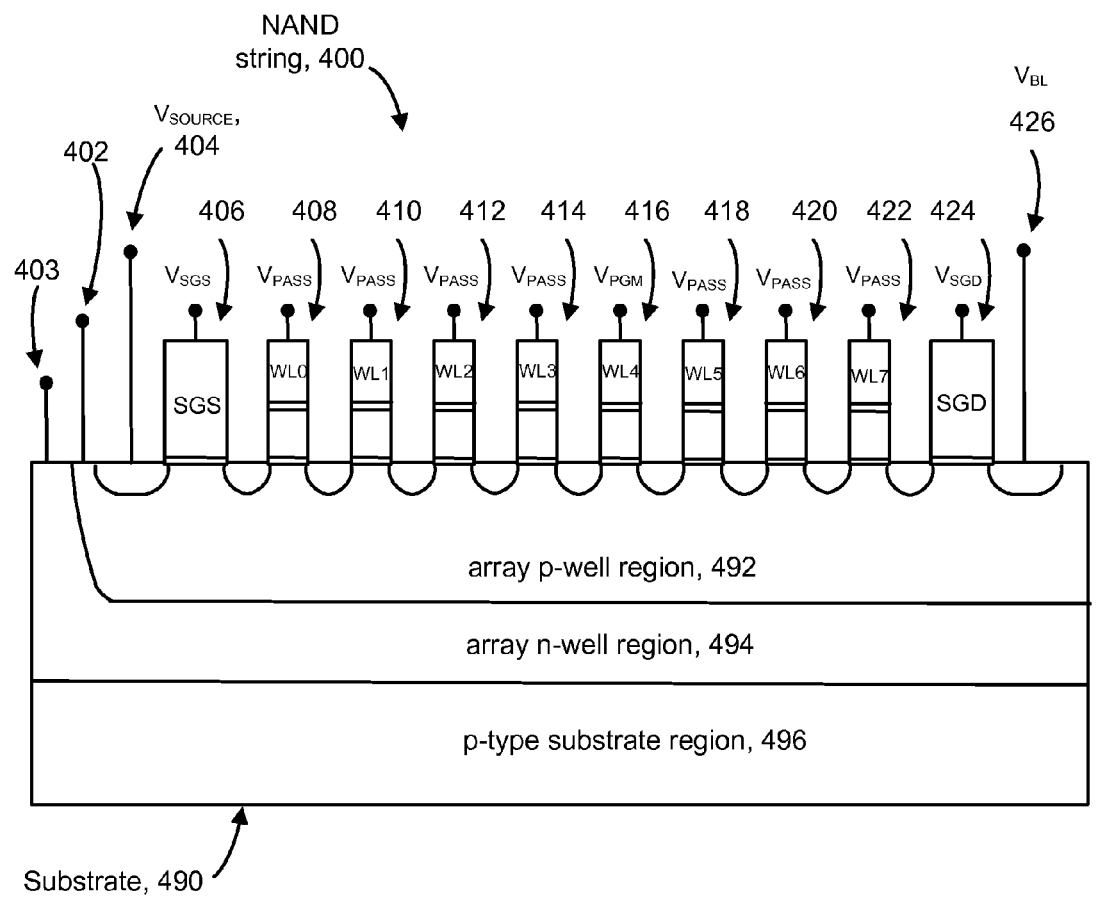
FIG. 3A depicts a cross-sectional view of a NAND string formed on a substrate.

FIG. 3A depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one embodiment, the substrate 490 employs a triple-well technology which includes an array p-well region 492 within an array n-well region 494, which in turn is within a p-type substrate region 496. The NAND string and its non-volatile storage elements can be formed, at least in part, on the array p-well region 492. A source supply line 404 with a potential of $V_{SOURCE}$ is provided in addition to a bit line 426 with a potential of $V_{BL}$. Voltages, such as body bias voltages, can also be applied to the array p-well region 492 via a terminal 402 and/or to the array n-well region 494 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. $V_{SGS}$ and $V_{SGD}$ are applied to the select gates 406 and 424, respectively.

Figure 3B:
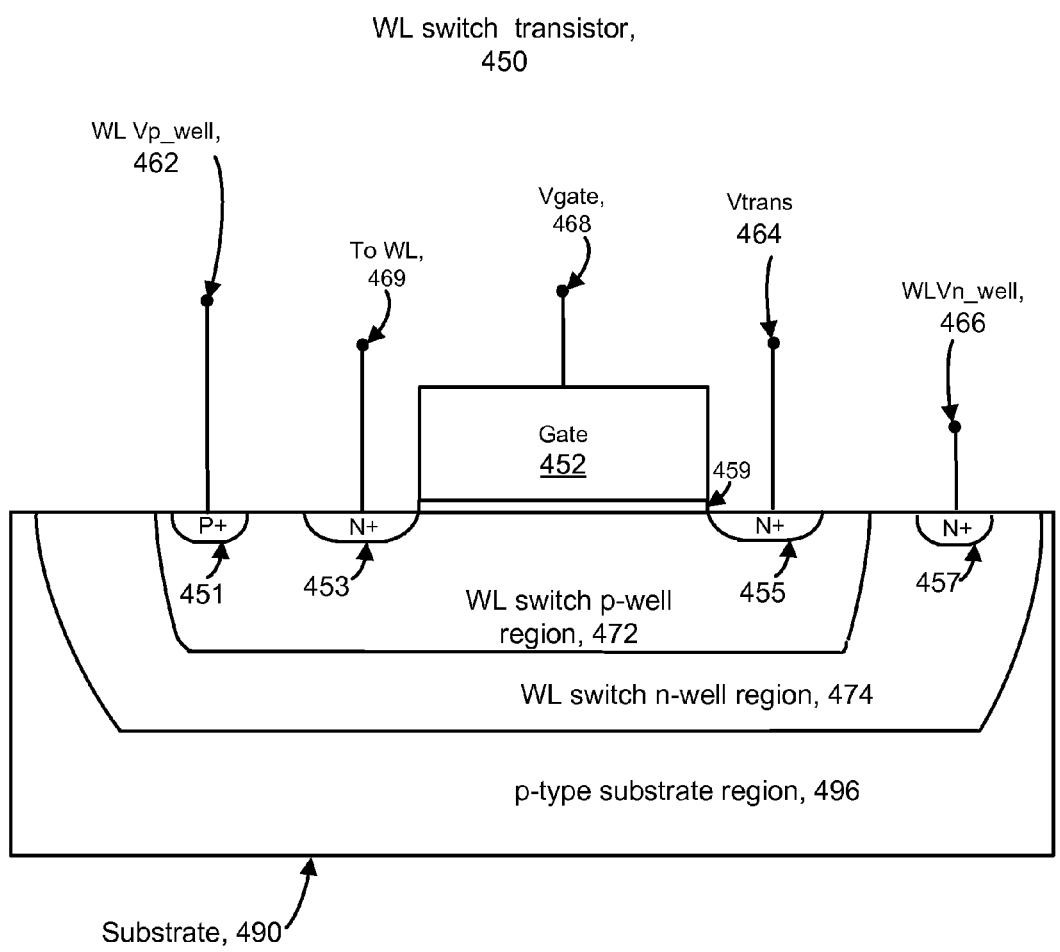
FIG. 3B depicts one embodiment of a word line switch transistor.

FIG. 3B depicts one embodiment of a word line switch transistor 450, which may be used to provide a voltage to a word line. In one embodiment, the substrate 490 employs a triple-well technology which includes a WL switch p-well region 472 within a WL switch n-well region 474, which in turn is within a p-type substrate region 496. The p-type substrate region 496 may be a different part of the same p-type substrate region 496 as the NAND string (see, e.g., FIG. 3A). However, the WL switch n-well region 474, and WL switch p-well region 472 are separate from the array n-well region 494 and the array p-well region 492 that the NAND strings are formed in. Therefore, the wells (472, 474) of the WL switch transistor 450 may be independently biased from the wells (492, 494) the NAND strings are in.

The WL switch p-well region 472 has a P+ region 451 in one embodiment to provide better electrical contact to terminal 462 for applying the voltage WL $V_{P\_WELL}$. The n-well region 474 has an N+ region 457 in one embodiment to provide better electrical contact to terminal 466 for applying WL $V_{N\_WELL}$ 466. In one embodiment, WL $V_{P\_WELL}$ is a negative voltage during various operations. However, note that it is not necessarily maintained at the same voltage throughout operation. For example, a different negative voltage might be used for program than for read. In one embodiment, WL $V_{N\_WELL}$ is set to $V_{DD}$ (e.g., 3.2V) during program operations; however, another voltage could be used. In one embodiment, the p-type substrate region 496 remains grounded while operating the memory device.

In this embodiment, the WL switch transistor 450 has two N+ regions 453, 455, one of which may be a source and the other a drain. One N+ region 453 is connected to one of the word lines in the memory array 200 via terminal 469. A voltage $V_{TRANS}$ may be applied to the other N+ region 455 via terminal 464. The transistor has a gate 452 over a gate oxide 459. A voltage $V_{GATE}$ may be applied to the gate 452 via terminal 468. In one embodiment, a "select voltage" $V_{SELECT}$ is applied to the gate 452 to turn transistor 450 on, and an "tinseled voltage" $V_{UNSELECT}$ is applied to the gate 452 to keep transistor 450 off. If a select voltage is used to turn on the transistor 450, $V_{TRANS}$ may be passed through to the word line. In one embodiment, the threshold voltage of the WL switch transistor 450 is negative when the substrate bias (e.g., p-well bias) is zero volts.

When programming, $V_{TRANS}$ may be the program voltage (e.g., $V_{PGM}$), which may be passed to the selected word line. This is assuming that the WL switch transistor 450 is used to select a word line. The WL switch transistor 450 may also be used to provide a voltage $V_{PASS}$ to unselected word lines during programming. During a read operation, the voltage $V_{TRANS}$ may be a read compare voltage (e.g., $V_{CGRV}$) that is passed to the selected word line. For unselected word lines, $V_{TRANS}$ may be Vread. During erase, a word line erase voltage (e.g., $V_{WL\_ERASE}$) may be provided to word lines in blocks that are selected for erase by using $V_{WL\_ERASE}$ as $V_{TRANS}$. Note that the WL switch transistor 450 is typically not used to pass a voltage to the word lines in blocks that are not selected for erase. Further details of applying voltages during program, read (or verify), and erase are discussed below.

Figure 4A:
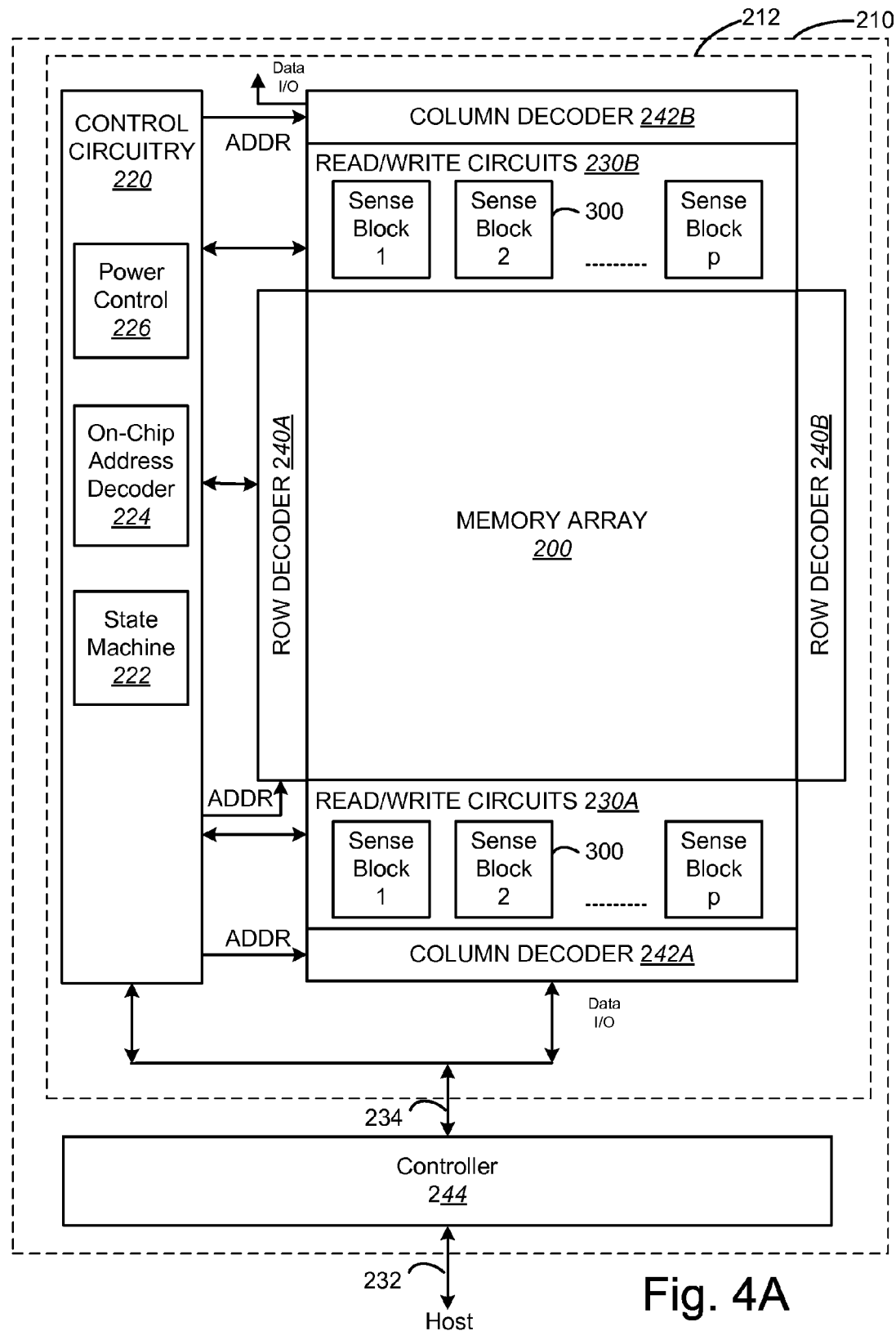
FIG. 4A illustrates a non-volatile storage device.

FIG. 4A illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. The control circuitry 220 of one embodiment is able to provide array $V_{P\_WELL}$ to the array p-well region 492 (via terminal 402) and array $V_{N\_WELL}$ to the array n-well region 494 (via terminal 403). The control circuitry 220 of one embodiment is able to provide WL $V_{P\_WELL}$ to the WL switch p-well region 472 (via terminal 462) and WL $V_{N\_WELL}$ to the WL switch n-well region 474 (via terminal 466).

In one embodiment, the row decoder 240A and/or row decoder 240B includes a number of word line switch transistors 450. Each WL switch transistor 450 may be electrically connected to one word line in the memory array 200.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4B:
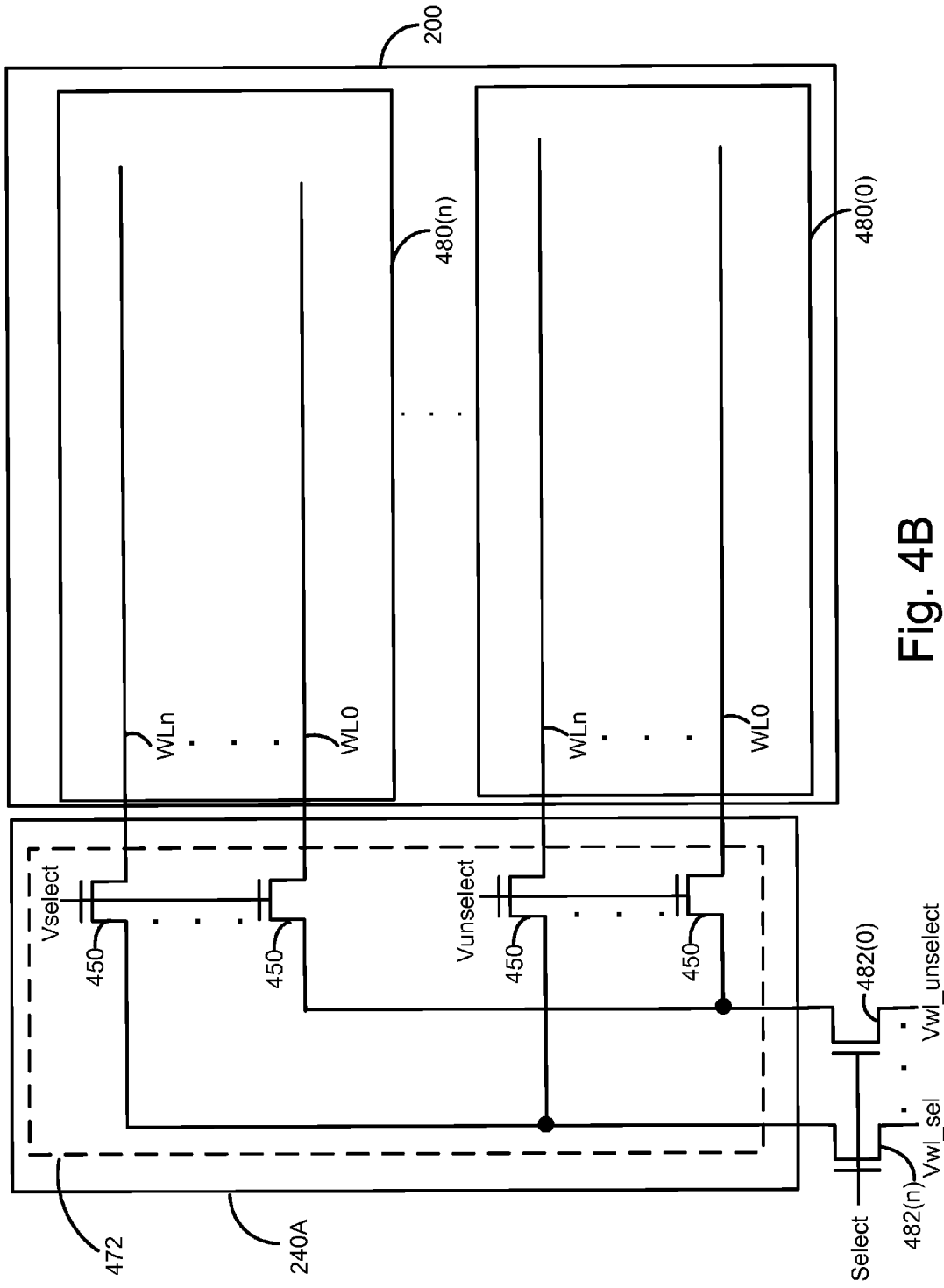
FIG. 4B depicts a schematic diagram of a portion of one embodiment of a memory array and associated row decoders.

FIG. 4B depicts a schematic diagram of a portion of one embodiment of a memory array 200 and associated row decoders 240A. FIG. 4B provides more details of one embodiment of the memory array 200 and associated row decoders 240A of FIG. 4A. The memory array 200 has blocks 480(0)-480(n). Two blocks 480 are depicted in the memory array 200 in FIG. 4B, although there typically may be many more blocks 480. For purposes of discussion, block 480(n) is selected and block 480(0) is unselected. Typically, there is one selected block, whereas the rest are unselected. Each block 480 may have word lines WL0-WLn. Only two word lines are depicted in each block, although there may be many more. In this example, WLn is selected (in each block). The rest of the word lines are unselected. Typically, there is one selected word line in each block, whereas the rest are unselected. Note that a "selected" word line that is in an unselected block will not be programmed or read. Rather, it is the selected word line in the selected block that is programmed or read.

The row decoders 240A include a WL switch transistor 450 connected to each word line. In one embodiment, the gates of all of the WL switch transistors 450 that are associated with one block are connected together. However, this is not a requirement. A select voltage (e.g., $V_{SELECT}$) may be applied to the gates of the WL switch transistor 450 to select a block. For example, block 480(n) is being selected. Examples of select voltages will be discussed in more detail below. In one embodiment, the select voltage is referred to as $V_{PGMH}$ for a program operation. In one embodiment, the select voltage is referred to as $V_{READH}$ for a read operation. In one embodiment, $V_{DD}$ is used for the select voltage for an erase operation. In some embodiments, $V_{SS}$ is used for the unselect voltage (e.g., $V_{UNSELECT}$).

Outside of the row decoder region 240A are a number of voltage transistors 482(0)-482(n). Each WL switch transistor 450 is provided a voltage by one of the voltage transistors 482(0)-482(n). In one embodiment, one of the voltage transistors 482 provides a voltage for a selected word line (via a WL switch transistor 450), and the rest provide a voltage for unselected word lines. For example, one voltage transistor 480 may provide $V_{PGM}$, whereas the rest may provide $V_{PASS}$. During a read operation, one voltage transistor may provide $V_{CGRV}$, whereas the rest may provide Vread. During one embodiment of an erase operation, all of the voltage transistors may provide the same voltage.

In the depicted arrangement of FIG. 4B, one WL switch transistor 450 in each block receives $V_{WL\_SEL}$, whereas the rest receive $V_{WL\_UNSELECT}$. The WL switch transistors 450 in the selected block 480(n) pass their respective voltages to their word lines. Thus, WLn in block 480(n) receives $V_{WL\_SEL}$ and the rest of the word lines in block 480(n) receive $V_{WL\_UNSELECT}$.

For the unselected blocks, the word lines may end up at the same voltage as the gate of the WL switch transistor 450, at least during program and read operations. For example, $V_{SS}$ may be applied to the gates of transistors 450 for unselected blocks. During program and read operations, this may result in all word lines in unselected blocks being at $V_{SS}$. However, erase operations may be different. During erase, the word lines in the unselected blocks may tend to move towards the erase voltage that is applied to the array p-well region 492.

Note that the WL switch p-well region 472 is depicted in FIG. 4B as dashed lines. Thus, all of the WL switch transistors 450 reside in the same p-well, in this embodiment. However, the WL switch transistors 450 could reside in different p-wells. Also, circuit elements other than the WL switch transistors 450 could reside in the p-well 472, in some embodiments.

Figure 5A:
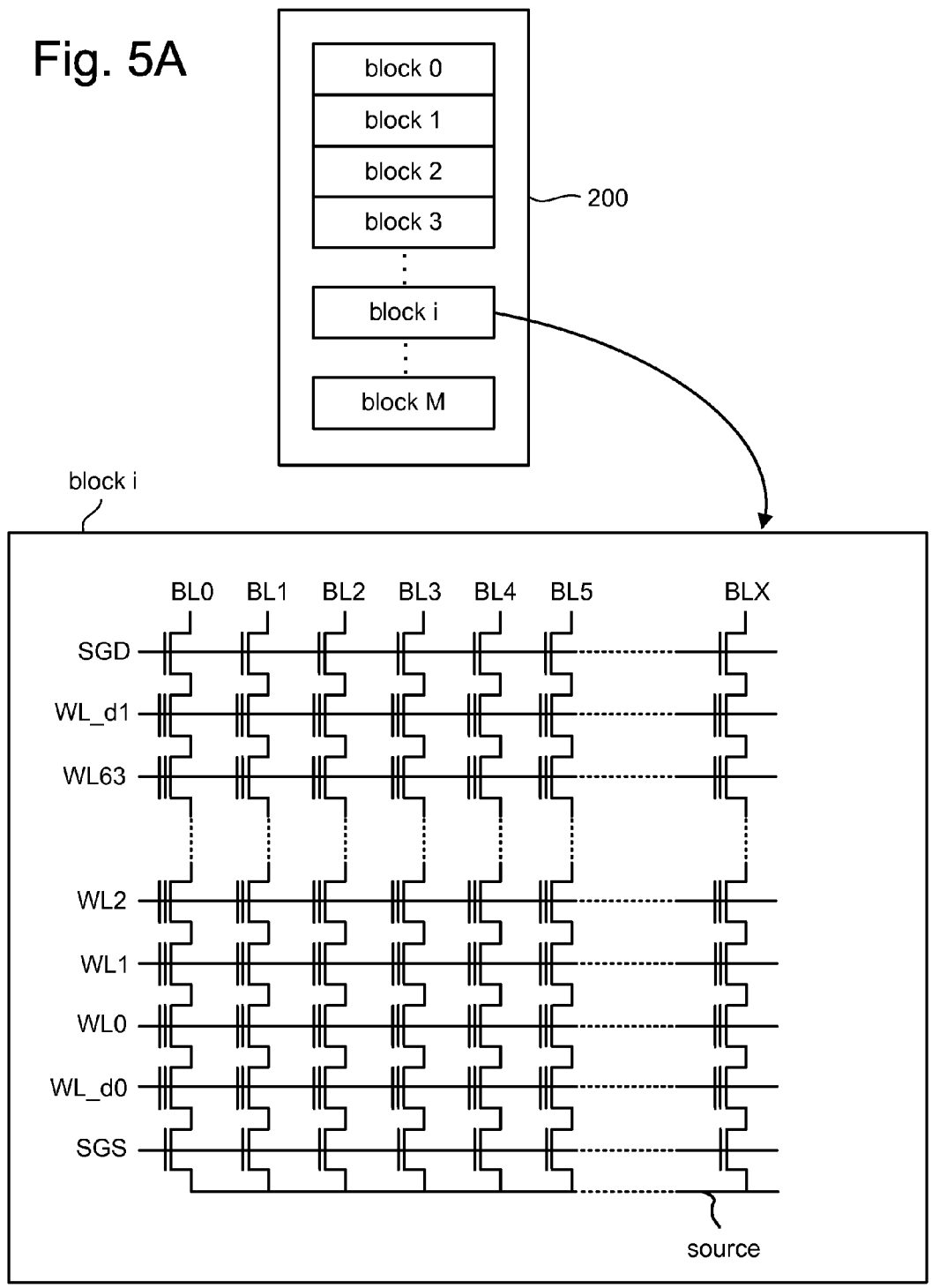
FIG. 5A depicts an exemplary structure of memory cell array.

FIG. 5A depicts an example structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. In one embodiment, the controller 244 is able to correct a certain number of misreads, based on the ECC.

Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5A shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 5B:
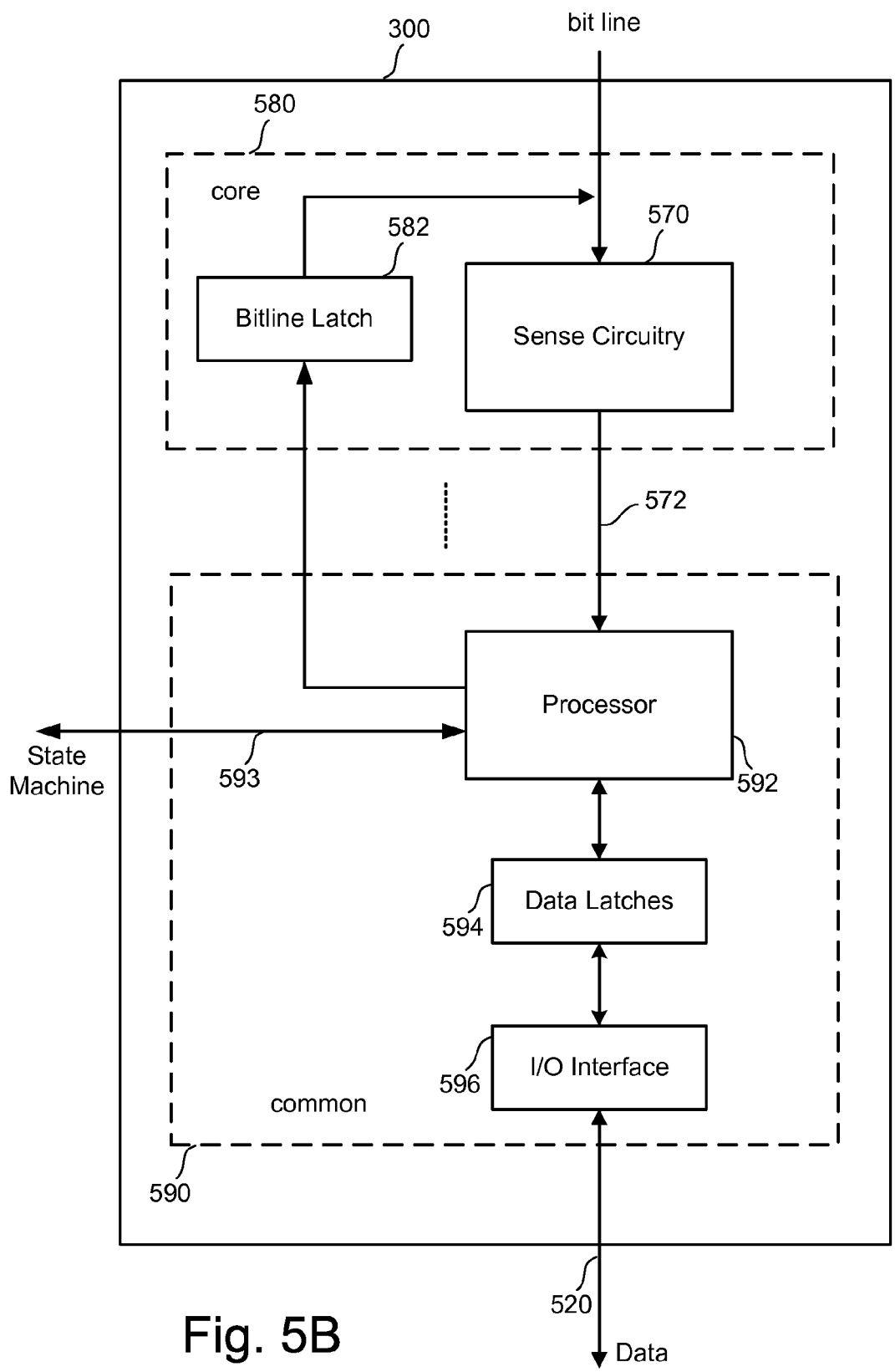
FIG. 5B is a block diagram of an individual sense block.

FIG. 5B is a block diagram of an individual sense block 300 partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572. For further details, refer to U.S. Patent Application Publication 2006/0140007, which is incorporated herein by reference in its entirety.

Sense module 580 comprises sense circuitry 570 that determines whether a conduction current in a connected bit line is above or below a predetermined threshold level. In some embodiments, sense module 580 includes a circuit commonly referred to as a sense amplifier. Sense module 580 also includes a bit line latch 582 that is used to set a voltage condition on the connected bit line. For example, a predetermined state latched in bit line latch 582 will result in the connected bit line being pulled to a state designating program inhibit (e.g., $V_{DD}$).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed memory cell and store the determined data in the set of data latches. The set of data latches 594 is used to store data bits determined by processor 592 during a read operation. Data latches 594 may also be used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 222 that controls the supply of different control gate voltages to the addressed cell. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

It is anticipated that some implementations will include multiple processors 592. In one embodiment, each processor 592 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 592 to accumulate the results of the associated bit lines such that the state machine need only read the wired-OR line one time.

During program or verify, the data to be programmed is stored in the set of data latches 594 from the data bus 520. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 592 monitors the verified memory state relative to the desired memory state. When the two are in agreement, processor 592 sets the bit line latch 582 so as to cause the bit line to be pulled to a state designating program inhibit. This inhibits the cell coupled to the bit line from further programming even if it is subjected to programming pulses on its control gate. In other embodiments the processor initially loads the bit line latch 582 and the sense circuitry sets it to an inhibit value during the verify process.

Data latch stack 594 contains a stack of data latches corresponding to the sense module. In one embodiment, there are 3-5 (or another number) data latches per sense module 580. In one embodiment, the latches are each one bit. In some implementations (but not required), the data latches are implemented as a shift register so that the parallel data stored therein is converted to serial data for data bus 520, and vice versa. In one embodiment, all the data latches corresponding to the read/write block of M memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Pat. No. 7,046,568, "Memory Sensing Circuit and Method for Low Voltage Operation; (4) U.S. Pat. No. 7,196,928, "Compensating for Coupling During Read Operations of Non-Volatile Memory," and (5) U.S. Pat. No. 7,327,619, "Reference Sense Amplifier For Non-Volatile Memory". All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores three bits of data. Other embodiment, however, may use more or fewer than three bits of data per memory cell. FIG. 6A shows eight Vt distributions corresponding to an Erase state and programmed states A-G. In one embodiment, the threshold voltages in the Erase state are negative and the threshold voltages in the programmed states A-G are positive.

However, the threshold voltages in one or more of programmed states A-G may be negative. Thus, in one embodiment, at least VrA is negative. Other voltages such as VvA, VrB, VvB, etc., may also be negative. In one embodiment, a negative voltage is applied to the body of the word line switch transistors 450 to allow passing a negative read compare voltage (e.g., VrA) to the word lines. Also note that by allowing negative threshold voltages in the programmed states, the total width of the range of programmed states can be increased. This may increase the space between threshold voltage distributions.

Between each of the data states are read reference voltages used for reading data from memory cells. For example, FIG. 6A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 6A shows VvA for the A-state and VvB for the B-state. When programming memory cells to a given state, the system will test whether those memory cells have a threshold voltage greater than or equal to the verify reference voltage.

FIG. 6B illustrates that Vt distributions can partially overlap since the error correction algorithm can handle a certain percentage of cells that are in error. Note that in some embodiments, at one point in time the threshold voltage distribution may resemble FIG. 6A and at another time the threshold voltage distributions may overlap, as in FIG. 6B. For example, just after programming, the threshold voltage distribution may resemble FIG. 6A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 7:
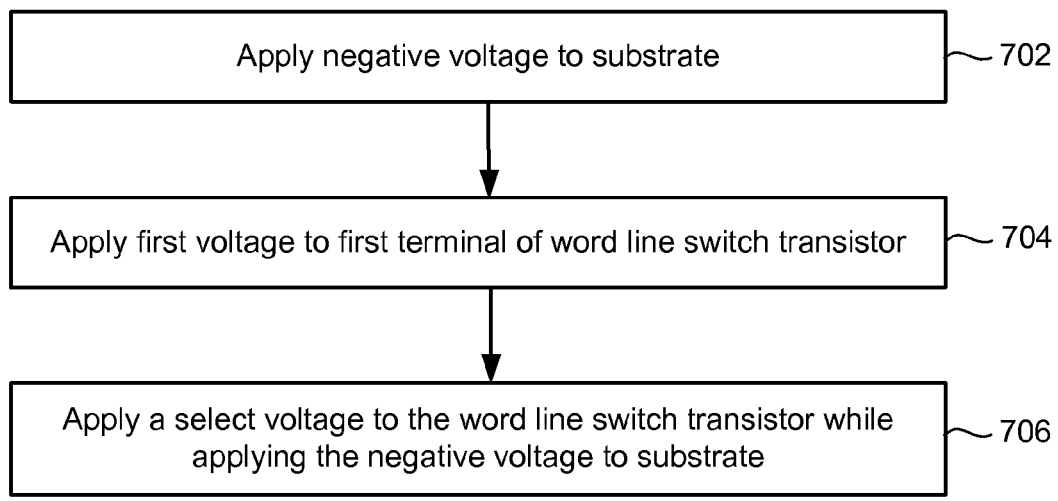
FIG. 7 is a flowchart of one embodiment of a process of operating a WL switch transistor.

FIG. 7 is a flowchart of one embodiment of a process 700 of operating a WL switch transistor 450. Process 700 describes operating a WL switch transistor 450 for a selected word line in a selected block. The process 700 may be used during various operations such as programming, verifying, reading, and erasing. Process 700 will be described with reference to FIG. 3B as a matter of convenience. However, it will be understood that process 700 is not limited to the embodiment of FIG. 3B.

In step 702, a negative voltage is applied to the substrate 490 below the word line switch transistor 450. Note that the negative voltage might be applied to a portion of the substrate 490. For example, a negative voltage (e.g., WL $V_{P\_WELL}$) may be applied to WL switch p-well region 472. The magnitude of the negative voltage may depend on what operation (e.g., program, read or verify, erase) is being performed. Further details are discussed below.

In step 704, a first voltage is applied to a first terminal of a WL switch transistor 450. The first voltage may be voltage that is to be provided to a selected word line. This could be a program voltage (e.g., $V_{PGM}$), a read compare voltage (e.g., $V_{CGRV}$), a verify voltage, or even a voltage during an erase operation. Referring to FIG. 3B, $V_{TRANS}$ may be applied to N+ region 455 via terminal 464.

In step 706, a select voltage is applied to the WL switch transistor 450 while applying the negative voltage to the substrate 490, as well as the voltage to the first terminal. In some embodiments, the select voltage is greater than the voltage to be passed to the word line by at least the threshold voltage of the WL switch transistor 450. For example, $V_{SELECT}$ may be applied to the gate 452 while applying WL $V_{P\_WELL}$ and $V_{TRANS}$. During one embodiment of programming, $V_{SELECT}$ should be higher than the programming voltage. For example, the voltage $V_{PGMH}$ should be higher than $V_{PGM}$. During one embodiment of read, $V_{SELECT}$ should be higher than a read compare voltage. For example, $V_{READH}$ should be higher than $V_{CGRV}$. During one embodiment of erase, $V_{SELECT}$ should be higher than a voltage to be applied to word lines. For example, $V_{SELECT}$ may be $V_{DD}$ for an erase operation.

Note that in some embodiments the p-type substrate region 496 is grounded during process 700. As noted above, the WL switch transistors 450 and the memory cells may be formed over the same p-type substrate region 496. Also note that p-type substrate region 496 may stay grounded for all memory array operations. However, note that different back biases may be applied to the WL switch p-well region 472 for different operations.

In one embodiment, $V_{DD}$ is applied to the WL switch n-well region 474 during process 700. In one embodiment, WL switch n-well region 474 is kept at $V_{DD}$ for all memory array operations. However, the voltage to WL switch n-well region 474 could be different for different memory array operations.

Figure 8:
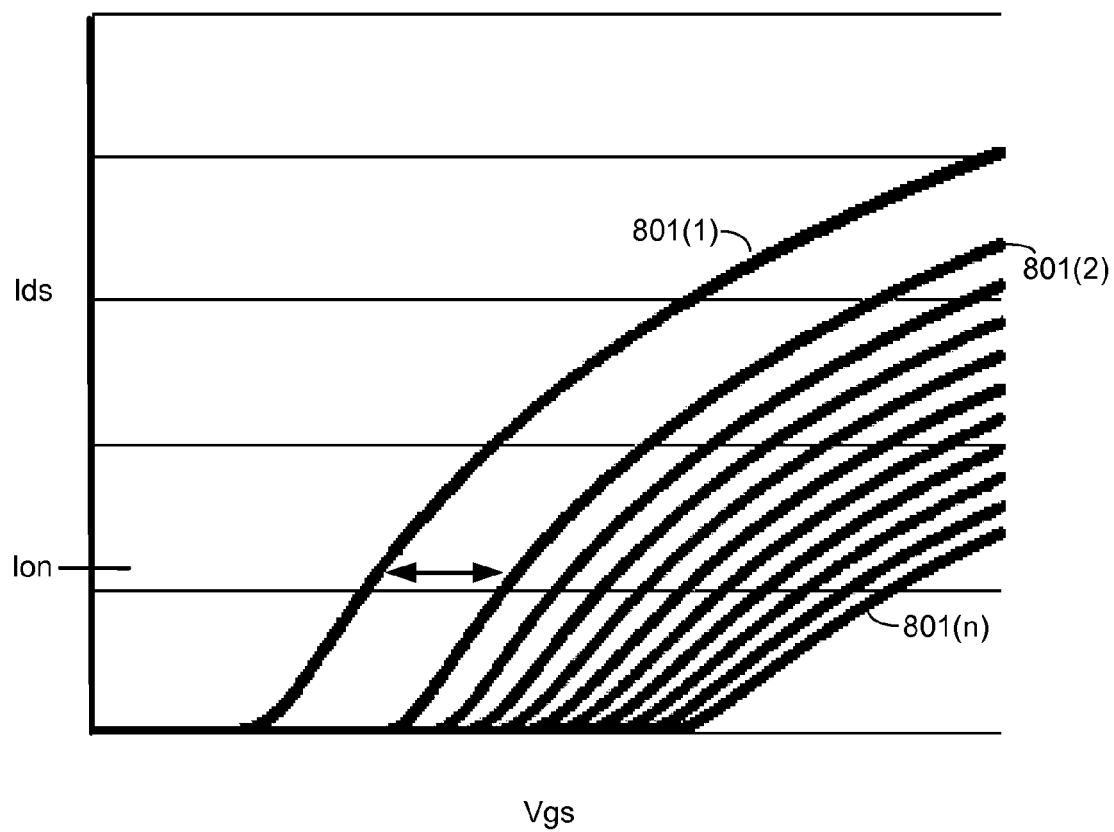
FIG. 8 depicts a graph of Ids versus $V_{GS}$ for various values of $V_{BS}$ for embodiments.

The following discussion provides some reasons why the negative voltage may provide a benefit during programming. FIG. 8 depicts curves 801(1)-801(n) of $I_{DS}$ versus $V_{GS}$ for various values of $V_{BS}$ (body to source voltage) for embodiments. Each curve 801 represents a different body bias. Curve 801(1) represents no back bias, and curve 801(2) represents 2V of back bias (e.g., $V_{BS}$ is −2.0V). The current $I_{ON}$ represents the current at the threshold voltage. Note that when the body bias (or back bias) moves from 0V to −2V, there is a large change in the threshold voltage (as given by $V_{GS}$ at $I_{ON}$). However, for other 2V changes in back bias, there is a smaller change in threshold voltage. For some devices, the Vt shift due to body bias is roughly proportional to the square root of the back bias voltage. In some embodiments, the large shift in threshold voltage may be avoided by maintaining a back bias throughout various operations (e.g., program, read, erase). In some embodiments, by always using back bias, the large shift in threshold voltage may be avoided. This may allow the select voltage (e.g., $V_{PGMH}$) during programming to be reduced. As has been discussed, a lower $V_{PGMH}$ reduces requirements on charge pumps that produce high voltages.

Figures 9A, 9B:
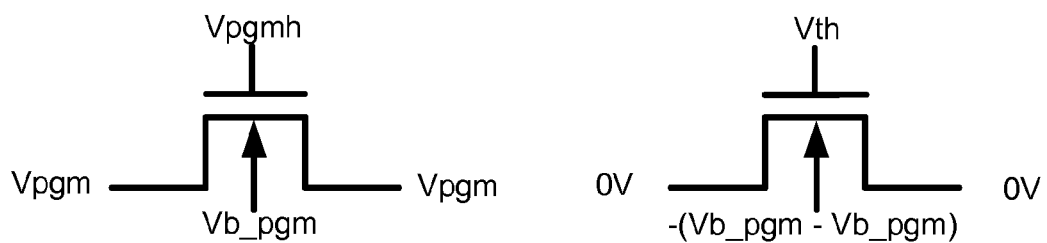
FIG. 9A shows possible voltages applied to the WL switch transistor during a programming operation.
FIG. 9B depicts a possible equivalent for the voltage of FIG. 9A, if the source voltage is set to 0V instead of $V_{PGM}$.

FIG. 9A shows possible voltages applied to the WL switch transistor 450 during a programming operation. In this example, $V_{PGM}$ is applied to one terminal and passed through to the other terminal. The voltage $V_{PGMH}$ on the gate should be at least equal to the threshold voltage. The back bias voltage is $V_{B\_PGM}$. FIG. 9B depicts a possible equivalent for the voltage of FIG. 9A, if the source voltage is set to 0V instead of $V_{PGM}$.

Figure 10A:
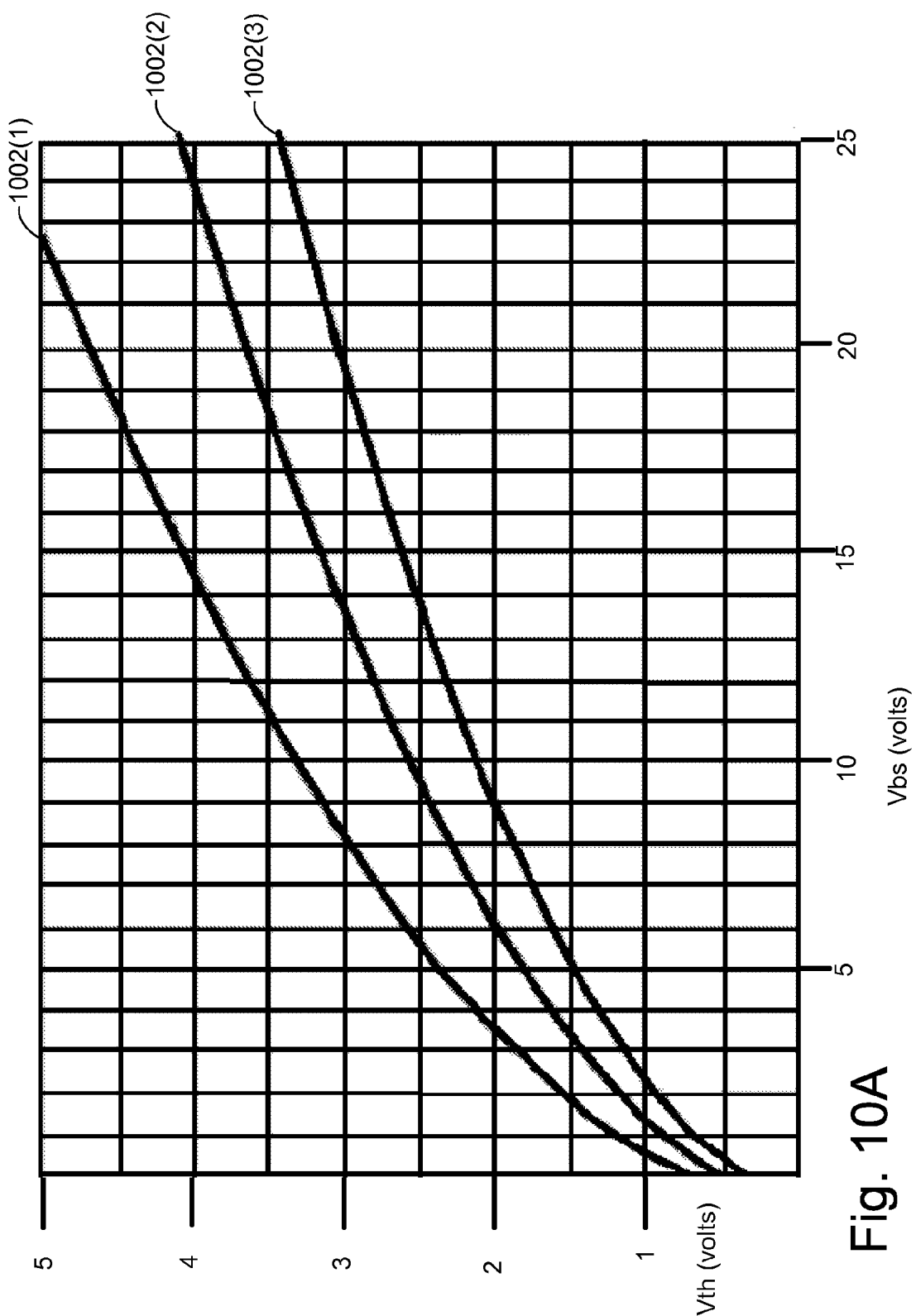
FIG. 10A shows a graph to help illustrate a possible improvement for one embodiment of programming using back-bias on the WL switch transistor.
Figure 10B:
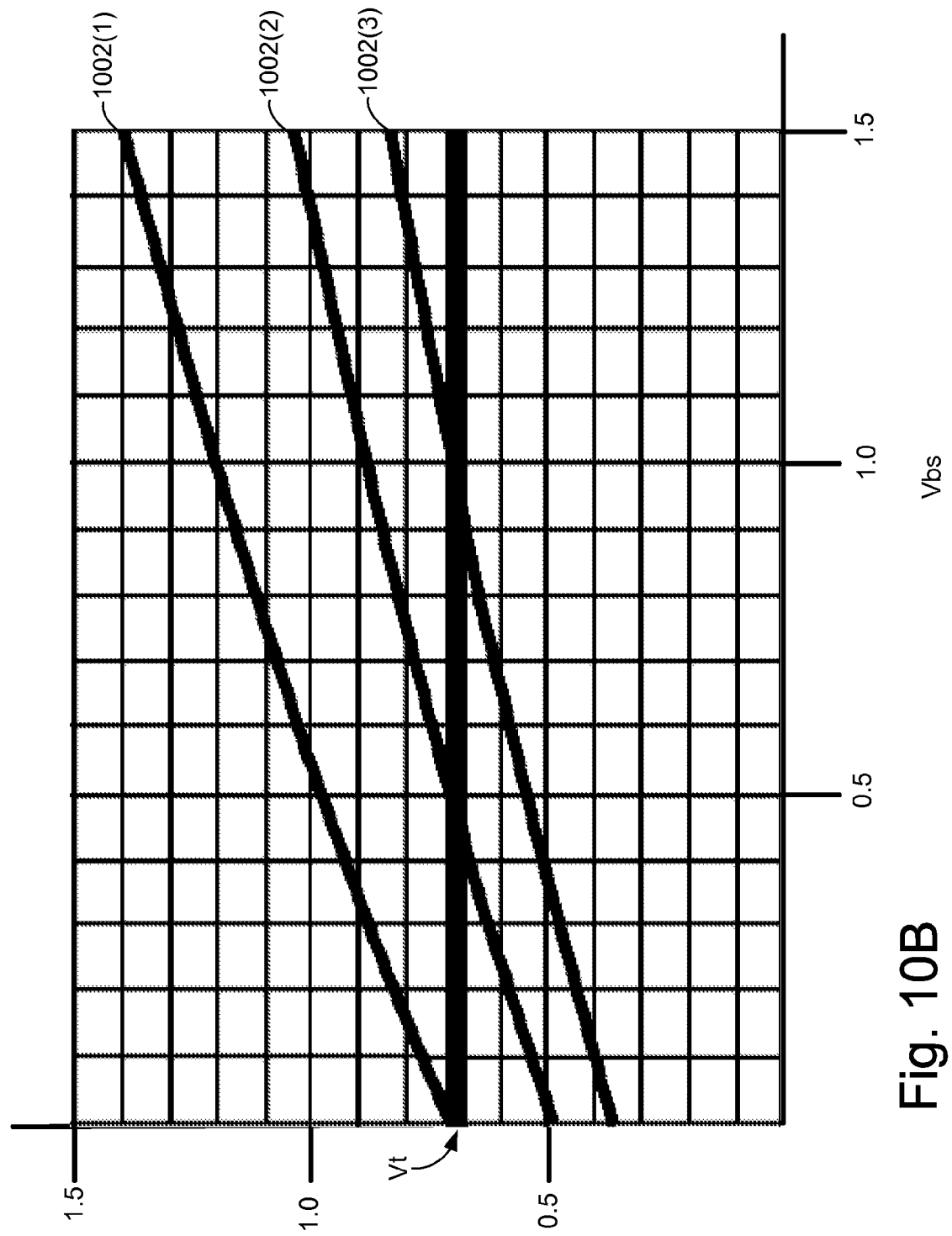
FIG. 10B depicts a portion of the curves from FIG. 10A near the threshold voltage.

FIG. 10A shows a graph to help illustrate a possible improvement for one embodiment of programming using back bias on the WL switch transistor 450. FIG. 10A depicts curves 1002(1)-1002(3) of Vt versus $V_{BS}$ for several different back bias voltages. FIG. 10B depicts those curves 1012(1)-1012(3) near the threshold voltage.

The threshold voltage of the WL switch transistor 450 may be estimated based on the equation 1:

$$V_{th} = V_{FB} + 2\Psi_B + \frac{\sqrt{2q\varepsilon_{Si}N_A(2\Psi_B - V_{BS})}}{C_{OX}} \qquad \text{Eq. 1}$$

In one embodiment, the dopant density for the channel needed to maintain the same Vt is less than if back bias were not used. In one embodiment, $N_A$ is adjusted so that the Vt is 0.7V when $V_{BS}=V_{B\_PGM}$. Example values for $N_A$ are 3.35E16/cm³ for $V_{B\_PGM}$=0V (no back bias); 2.08E16/cm³ for $V_{B\_PGM}$=−0.5V; and 1.50E16/cm³ for $V_{B\_PGM}$=−1.0V. Referring to FIG. 10B, it may be seen that the threshold voltage is about 0.7V when $V_{BS}=V_{B\_PGM}$. For example, curve 1002(1), which represent no back bias, intersects 0.7V at $V_{BS}=0V$. Curve 1002(1), which represent back bias of 0.5V, intersects 0.7V at $V_{BS}=0.5V$. Curve 1002(2), which represent back bias of 1.0V, intersects 0.7V at $V_{BS}=1.0V$.

Referring to FIG. 10A, for a $V_{BS}$ of 20 volts it may be seen that the three cases show significantly different threshold voltages. For no back bias ($V_{B\_PGM}=0V$), the Vt is about 4.7 V. For a back bias of 0.5V ($V_{B\_PGM}=-0.5V$), the Vt is about 3.7 V. For a bias of 1.0V ($V_{B\_PGM}=-1.0V$), the Vt is about 3.1 V. Therefore, the Vt at $V_{BS}$ of −20V decreases by about 1.0V for $V_{BS}=-0.5V$ and about 1.6V for $V_{BS}=-1.0V$, in this example.

Table I summarizes the foregoing example for program voltages ($V_{PGM}$) of 15V, 20V, and 25V. Each column show the $V_{PGMH}$ needed for one value of $V_{B\_PGM}$. As can be seen the gate voltage ($V_{PGMH}$) needed to turn on the WL switch transistor is about 0.8V to 1.0V less for when $V_{B\_PGM}=-0.5V$ compared to no bias. The gate voltage ($V_{PGMH}$) needed to turn on the WL switch transistor is about 1.4V to 1.8V less for when $V_{B\_PGM}=-1.0V$ compared to no bias. Therefore, significantly less voltage is needed.

TABLE I

| | $V_{B\_PGM}=0$ V | $V_{B\_PGM}=-0.5$ V | $V_{B\_PGM}=-1.0$ V |
|---|---|---|---|
| $N_A$ (/cm$^2$) | 3.35E16 | 2.08E16 | 1.50E16 |
| $V_{PGM}=15$ V | 18.4 | 17.5 | 17.0 |
| $V_{PGM}=20$ V | 24.0 | 23.0 | 22.4 |
| $V_{PGM}=25$ V | 29.6 | 28.4 | 27.8 |

Figure 11E:
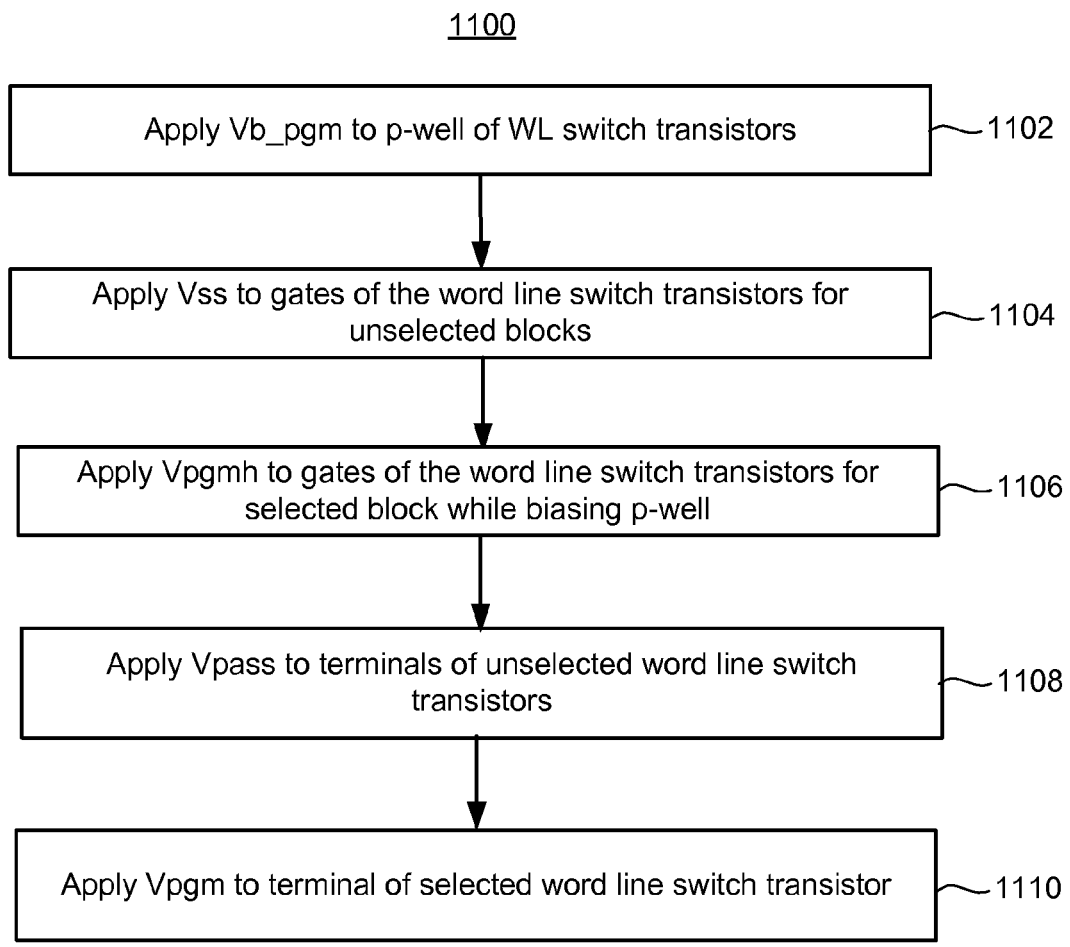
FIG. 11E is a flowchart of one embodiment of a process of programming non-volatile storage.

FIGS. 11A-11D show example biases that may be applied to the WL switch transistor 450 during programming. FIG. 11A depicts voltages for the selected block and selected word line. FIG. 11B depicts voltages for the selected block and unselected word line. FIG. 11C depicts voltages for an unselected block and a selected word line. As noted previously, a "selected" word line in an unselected block is neither programmed nor read in embodiments. FIG. 11D depicts voltages for an unselected block and unselected word line. FIG. 11E is a flowchart of one embodiment of a process 1100 of programming non-volatile storage.

Figure 13:
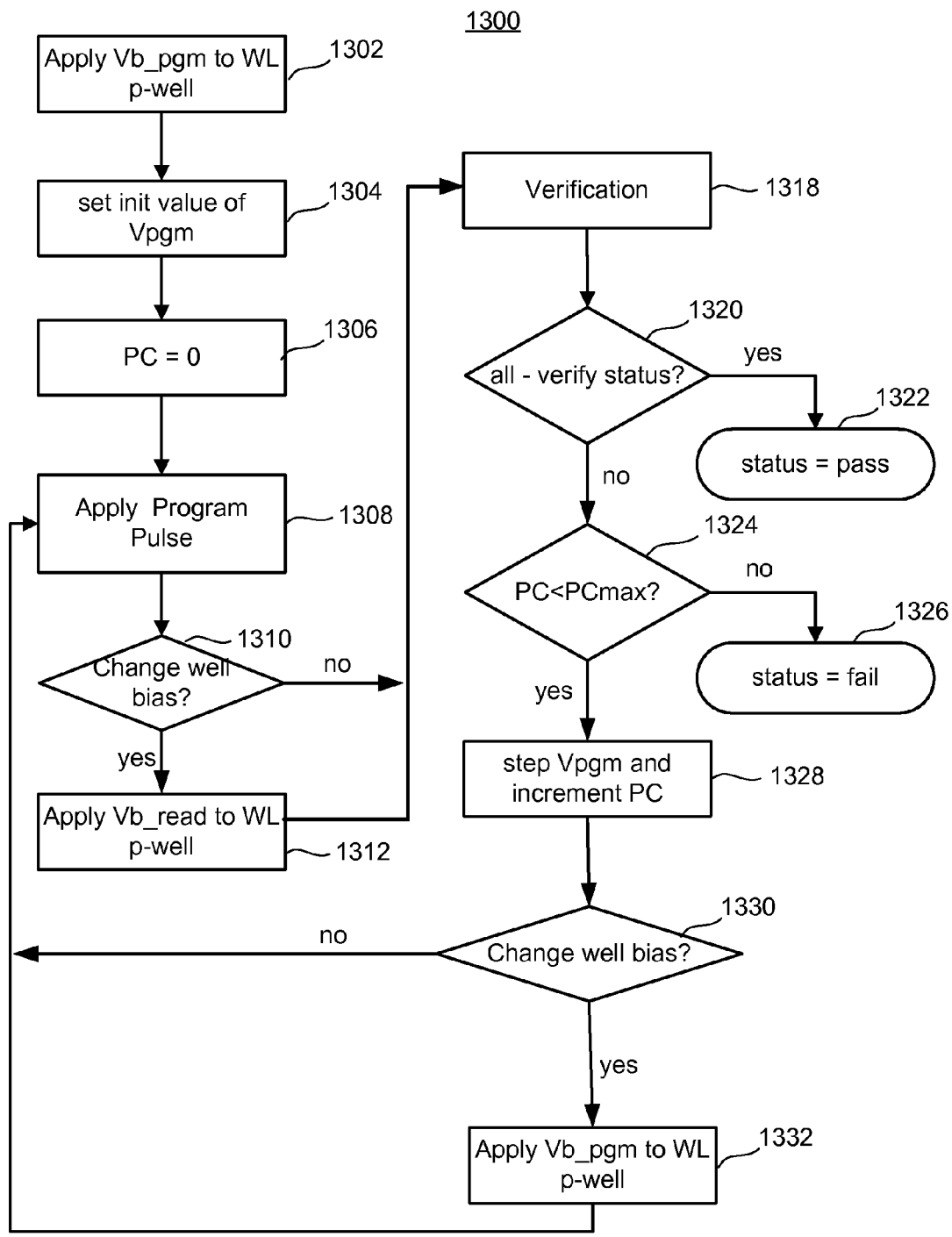
FIG. 13 is a flow chart describing one embodiment of a process programming memory cells.

Process 1100 is one embodiment of applying the voltages of FIGS. 11A-11D. Reference will be made to FIG. 4B when discussing process 1100; however, note that process 1100 is not limited to the embodiment of FIG. 4B. Process 1100 describes applying a single program pulse to the selected word line. Typically, programming is achieved by applying one or more program pulses, following by program verify. Then, another one (or more) program pulses may be applied. Therefore, process 1100 may be performed numerous times during programming. An example program process including verify operations is depicted in FIG. 13 to be discussed below. Note that the steps of process 1100 are described in this order as a matter of convenience; other orders could be used.

In step 1102, $V_{B\_PGM}$ is applied to the WL switch p-well region 472. $V_{B\_PGM}$ may be a relatively small negative voltage. An example for $V_{B\_PGM}$ is between about −0.05V and −1.2V. However, $V_{B\_PGM}$ may have an absolute magnitude that is less than 0.05V or an absolute magnitude that is greater than 1.2V. In one embodiment, $V_{B\_PGM}$ is has an absolute magnitude that is less than about half of Vdd.

In step 1104, $V_{SS}$ is provided to the gates all of the word line switch transistors 450 in each of the unselected blocks. Note that at this time $V_{SS}$ may be provided to all of the word line switch transistors 450 in each of the selected blocks. Referring to FIG. 4B, $V_{UNSELECT}$ may be provided to transistors 450 for all blocks 480 at this time.

In step 1106, a $V_{PGMH}$ is applied to gates of the WL switch transistors 450 in the selected block. However, $V_{SS}$ is maintained for transistors 450 in each of the unselected blocks. Referring to FIG. 4B, $V_{SELECT}$ may be provided to transistors 450 for the selected block 480(n). However, $V_{UNSELECT}$ may be maintained for transistors 450 for all other blocks 480 at this time. In one embodiment, the same select voltage is applied to the gates of all of the WL switch transistors 450 in the selected block. However, a different select voltage could be applied to the unselected transistors for the selected block. For example, $V_{SELECT}$ could have a lower magnitude for unselected transistors in the selected block.

In step 1108, $V_{PASS}$ is applied to terminals of unselected WL switch transistors 450 for at least the selected block. In one embodiment, the selected WL switch transistor 450 in the selected block also receives $V_{PASS}$. This allows the selected word line to begin to charge up prior to applying the program voltage.

In one embodiment, $V_{PASS}$ is also provided to all of the WL switch transistors 450 in each of the unselected blocks. However, since those transistors 450 remain off, $V_{PASS}$ is not passed to word lines in unselected blocks.

In one embodiment, $V_{PASS}$ is generated by one or more charge pumps and provided to the voltage transistors 482. The select voltage that was applied to transistor 482(n) may also be applied to the rest of the voltage transistors 482. Therefore, $V_{PASS}$ may be provided to all of the unselected word line switch transistors 450 for the selected block.

In step 1110, $V_{PGM}$ is applied to a terminal of the selected WL switch transistor 450 for the selected block (e.g., FIG. 4B, 480(n)). In one embodiment, $V_{PGM}$ is generated by one or more charge pumps and provided to voltage transistor 482(n). A select voltage may be applied to transistor 482(n) to provide $V_{PGM}$ to the selected WL switch transistor 450 for the selected block.

In one embodiment, $V_{PGM}$ is also passed to a "selected" WL switch transistor 450 in each of the unselected blocks. Referring to FIG. 4B, transistor 482(n) may also provide $V_{PGM}$ to selected WL switch transistors 450 in unselected blocks (e.g., block 480(0)). However, as the transistors 450 in unselected blocks remain off, $V_{PGM}$ is not passed to word lines in the unselected blocks.

After the program pulse is applied to the selected word line in the selected block, a verify operation may be performed. Then, process 1100 may be repeated, typically with a program voltage of greater magnitude.

Figure 12E:
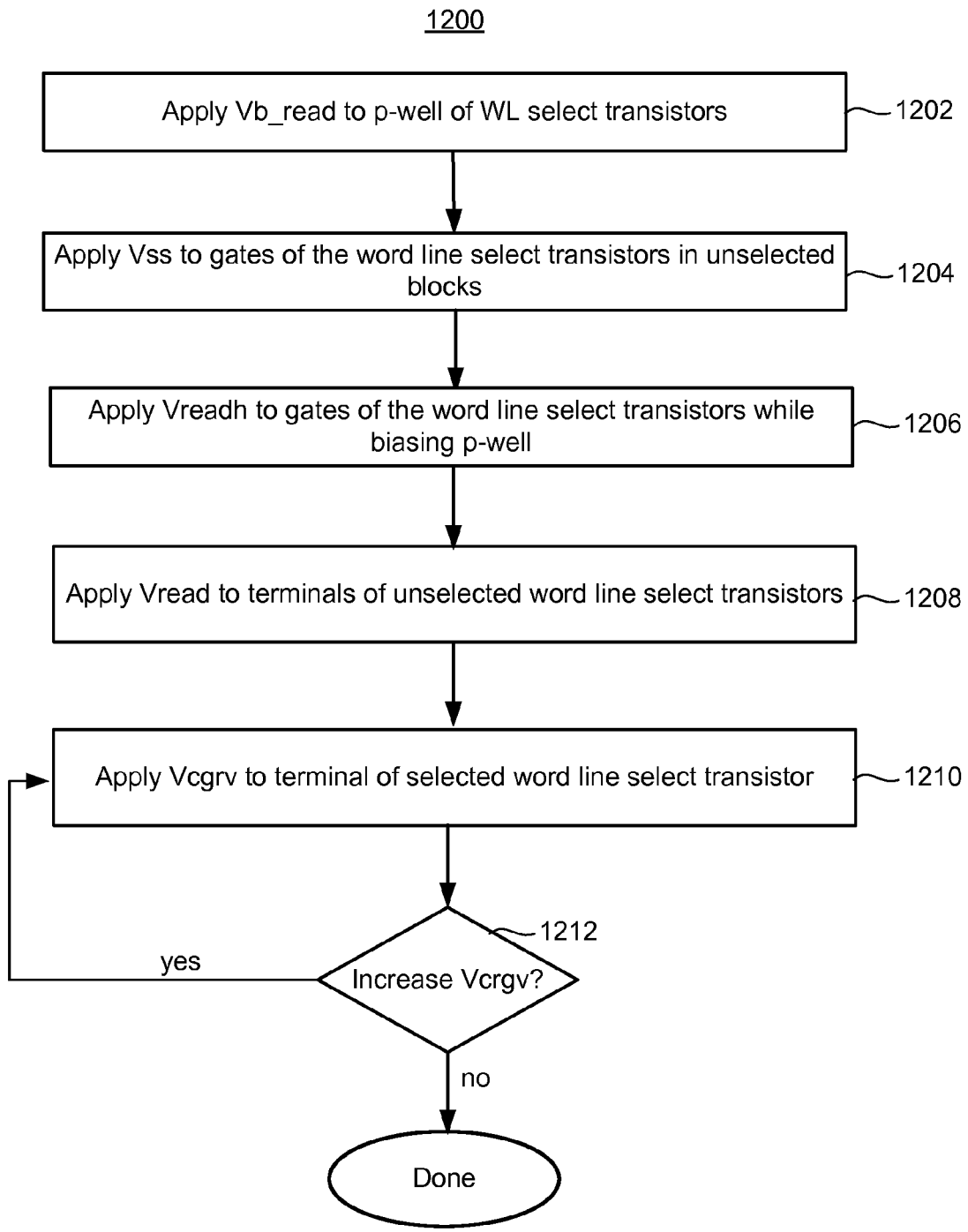
FIG. 12E is a flowchart of one embodiment of a process of programming non-volatile storage.

In one embodiment, back-biasing of the WL switch transistors 450 is used during read or verify operations. Back biasing WL switch transistors 450 may allow negative read compare voltages to be used. FIGS. 12A-12D show example biases that may be applied to the WL switch transistor 450 during a read or verify operation. FIG. 12A depicts voltages for the selected block and selected word line. FIG. 12B depicts voltages for the selected block and unselected word line. FIG. 12C depicts voltages for an unselected block and a selected word line. FIG. 12E is a flowchart of one embodiment of a process 1200 of programming non-volatile storage.

Process 1200 is one embodiment of applying the voltages of FIGS. 12A-12D during a read or verify operation. Reference will be made to FIG. 4B when discussed process 1200; however, note that process 1200 is not limited to the embodiment of FIG. 4B. Note that steps are not necessarily performed in the order discussed.

In step 1202, $V_{B\_READ}$ is applied to the WL switch p-well region 472. $V_{B\_READ}$ may be more negative than the smallest read compare voltage $V_{CGRV}$.

In step 1204, $V_{SS}$ is provided to the gates all of the word line switch transistors 450 in each of the unselected blocks. Note that at this time $V_{SS}$ may also be provided to all of the word line switch transistors 450 in each of the selected blocks. Referring to FIG. 4B, $V_{UNSELECT}$ may be provided to transistors 450 for all blocks 480 at this time.

In step 1206, a $V_{READH}$ is applied to gates of the WL switch transistors 450 in the selected block. However, $V_{SS}$ is maintained for transistors 450 in each of the unselected blocks. Referring to FIG. 4B, $V_{SELECT}$ may be provided to transistors 450 for the selected block 480(n). However, $V_{UNSELECT}$ may be maintained for transistors 450 for all other blocks 480 at this time. In one embodiment, the same select voltage is applied to the gates of all of the WL switch transistors 450 in the selected block. However, a different select voltage could be applied to the unselected transistors for the selected block. For example, $V_{SELECT}$ could have a lower magnitude for unselected transistors in the selected block.

In step 1208, $V_{READ}$ is applied to terminals of unselected WL switch transistors 450 for at least the selected block. In one embodiment, the selected WL switch transistor 450 in the selected block also receives $V_{READ}$. This allows the selected word line to begin to charge up prior to applying the program voltage.

In one embodiment, $V_{READ}$ is also provided to all of the WL switch transistors 450 in each of the unselected blocks. However, since those transistors 450 remain off, $V_{READ}$ is not passed to word lines in unselected blocks.

In one embodiment, $V_{READ}$ is generated by one or more charge pumps and provided to the voltage transistors 482. The select voltage that was applied to transistor 482(n) may also be applied to the rest of the voltage transistors 482. Therefore, $V_{READ}$ may be provided to all of the unselected word line switch transistors 450 for the selected block.

In step 1210, $V_{CGRV}$ is applied to a terminal of the selected WL switch transistor 450 for the selected block (e.g., FIG. 4B, 480(n)). Note that $V_{CGRV}$ may be negative. As noted, $V_{B\_READ}$ should be more negative than $V_{CGRV}$. In one embodiment, $V_{CGRV}$ is generated by one or more charge pumps and provided to voltage transistor 482(n). A select voltage may be applied to transistor 482(n) to provide $V_{CGRV}$ to the selected WL switch transistor 450 for the selected block.

In one embodiment, $V_{CGRV}$ is also passed to a "selected" WL switch transistor 450 in each of the unselected blocks. Referring to FIG. 4B, transistor 482(n) may also provide $V_{CGRV}$ to selected WL switch transistors 450 in unselected blocks (e.g., block 480(0)). However, as the transistors 450 in unselected blocks remain off, $V_{CGRV}$ is not passed to word lines in the unselected blocks.

During the read operation, the value of $V_{CGRV}$ may be incremented. In step 1212, a determination is made whether $V_{CGRV}$ should be incremented or increased. In one embodiment, $V_{CGRV}$ will be set to each of the read compare voltages (VrA, VrB, etc.) during the read operation. The read compare voltages may be increased from smallest to largest; however, a different order could be used.

During a verify operation the value of $V_{CGRV}$ may also be incremented. In one embodiment, $V_{CGRV}$ will be set to one or more of the verify compare voltages (VvA, VvB, etc.) during the verify operation. However, note that it is not required that all of the verify compare voltages be used during a single verify operation. This is because it may only be necessary to verify lower states early in programming, and higher states later in programming.

Process 1200 returns to step 1210 to apply the next compare voltage $V_{CGRV}$, until all compare voltages have been applied. In one embodiment, the back bias (e.g., $V_{B\_READ}$) is maintained at the same value throughout the read (or verify) operation.

FIG. 13 is a flow chart describing one embodiment of a process 1300 programming memory cells. This process 1300 describes a number of program cycles, with verify operations performed after applying one or more program pulses. Process 1300 may be performed once for each word line in a selected block.

In step 1302, $V_{B\_PGM}$ is applied to the WL switch p-well region 472. Step 1302 is one embodiment of step 1102 of FIG. 11E.

In step 1304, the system will set the magnitude of the initial program pulse. At step 1306, the program count PC will be set to initially be zero. In step 1308, a program pulse is applied to the appropriate word line(s).

In step 1310, a determination is made whether to change the well bias for a verify operation. For example, if the verify operation is to apply a negative verify compare voltage, then the well bias could be changed to $V_{B\_READ}$ (or some other negative voltage). Note that the well bias could be maintained at $V_{B\_PGM}$ during at least some verify operations. As noted, $V_{B\_PGM}$ could be a small negative voltage. Note that the determination may be based on what states are to be verified. For example, early in programming, it may be necessary to verify that some memory cells have been programmed to a state with a negative threshold voltage. However, later in programming, it may be that only memory cells being programmed to positive threshold voltage states are still being verified.

If step 1312 is performed, $V_{B\_READ}$ may be applied to the WL switch p-well region 472. Step 1317 is one embodiment of step 1202 of FIG. 12E. Otherwise, the WL switch p-well region 472 may remain biased at $V_{B\_PGM}$. Note that the p-well region 472 could be biased to level other than $V_{B\_READ}$ or $V_{B\_PGM}$.

In step 1318, the memory cells to be programmed on that word line(s) are verified to see if they have reached the target threshold voltage level. If all or almost all of the memory cells to be programmed have reached the target threshold voltage level (step 1320), then the programming process has completed successfully (status=pass) in step 1322. If not all or almost all of the memory cells have been verified, then it is determined in step 1324 whether the program count PC is less than a maximum allowed number of attempts (PCmax). If the program count is not less than PCmax, then the programming process has failed (step 1326). If the program count is less than PCmax, than in step 1328, the magnitude of program voltage signal $V_{PGM}$ is incremented by the step size (e.g., 0.3V) for the next pulse and the program count PC is incremented. Note that those memory cells that have reached their target threshold voltage are locked out of programming for the remainder of the current programming cycle.

After step 1328, the process of FIG. 13 continues at step 1330 to determine whether to change the well bias for program operation. If the well bias remained at $V_{B\_PGM}$ during the program operation, then there is no need to change the bias. In one embodiment, $V_{B\_PGM}$ is applied to the WL switch p-well region 472, in step 1332. Step 1332 is one embodiment of step 1102 of FIG. 11E. After establishing or keeping the back bias, the next program pulse is applied in step 1316.

Figures 14A, 14B:
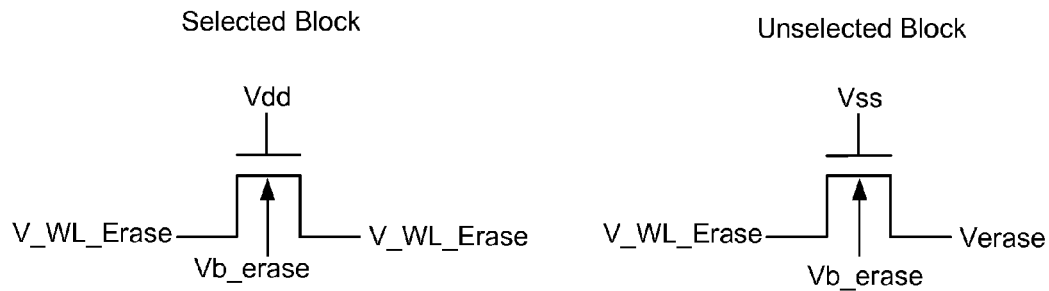
FIG. 14A shows example voltages that are applied to WL switch transistors for a selected block, in one embodiment.
FIG. 14B shows example voltages that are applied to WL switch transistors for an unselected block, in one embodiment.

In one embodiment, back bias is applied to WL switch transistors 450 during an erase operation. This may reduce or eliminate source-drain punch-through. FIG. 14A shows example voltages that are applied to WL switch transistors 450 for a selected block, in one embodiment. FIG. 14B shows example voltages that are applied to WL switch transistors 450 for an unselected block, in one embodiment.

For the selected block $V_{DD}$ may be applied to the gate a $V_{SELECT}$. For the unselected block $V_{SS}$ be applied to the gate as a $V_{UNSELECT}$. The back bias voltage may be $V_{B\_ERASE}$ for both selected and unselected blocks. An example back bias voltage for $V_{B\_ERASE}$ is −0.5V. However, $V_{B\_ERASE}$ may be higher or lower. Determining a suitable magnitude for $V_{B\_ERASE}$ will be discussed below.

The voltage $V_{WL\_ERASE}$ is provided to both the selected and unselected WL switch transistors. $V_{WL\_ERASE}$ is a voltage to which word lines are to be biased in blocks selected for erase. As FIG. 14A indicates, $V_{WL\_ERASE}$ is provided by the WL switch transistor 450 to a word line (not shown in FIG. 14A). In some embodiments, $V_{WL\_ERASE}$ is ground. In one embodiment, $V_{WL\_ERASE}$ is a relatively small positive voltage. For example, $V_{WL\_ERASE}$ could be about 0.5V or 1.0V, or some other value. However, note that $V_{WL\_ERASE}$ is not limited to any particular voltage magnitude. Note that it is not required that the same magnitude of $V_{WL\_ERASE}$ be applied to all word lines. For example, some word lines might be grounded, and other have a small positive voltage.

However, WL switch transistors 450 for unselected blocks do not pass $V_{WL\_ERASE}$ to their word lines. Instead, word lines in unselected blocks may tend to couple to the erase voltage (e.g., $V_{ERASE}$) that is applied to the array p-well 492 in the memory array 200. In some embodiments, $V_{ERASE}$ is a relatively large voltage. Note that the source to drain voltage for the unselected WL switch transistors 450 is the difference between $V_{WL\_ERASE}$ and the voltage of the WL in the unselected blocks (which may be as much as $V_{ERASE}$). Also note that this voltage difference could be significant enough to cause source-to-drain punch-through conduction, which may be undesirable.

However, the back bias voltage, $V_{B\_ERASE}$, may help to reduce or eliminate source-to-drain punch-through conduction. However, in some embodiments, if the back bias voltage is too negative, junction breakdown may occur in the WL switch transistor 450. Therefore, a suitable value may be determined for $V_{B\_ERASE}$ that it a compromise between reducing (or eliminating) source-to-drain punch-through conduction, while not increasing junction breakdown by more than a tolerable amount.

Figure 15:
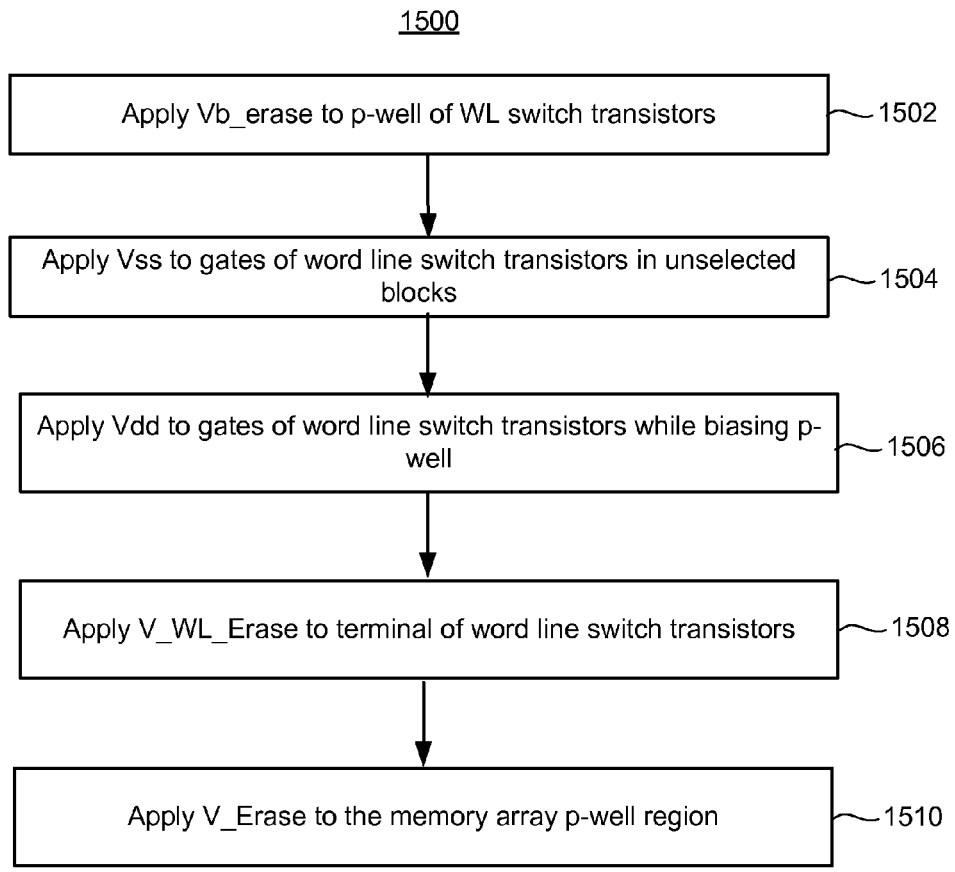
FIG. 15 is a flowchart of one embodiment of a process of operating word line switch transistors during an erase operation.

FIG. 15 is a flowchart of one embodiment of a process 1500 of operating word line switch transistors 450 during an erase operation. Note that steps are not necessarily performed in the order discussed.

In step 1502, $V_{B\_ERASE}$ is applied to the WL switch p-well region 472. $V_{B\_ERASE}$ may be a relatively small negative voltage. Factors in determining a suitable $V_{B\_ERASE}$ may include, but are not limited to, reducing source-drain punch-through conduction, while keeping junction breakdown to tolerable levels for WL switch transistors for unselected blocks.

In step 1504, $V_{SS}$ is provided to the gates all of the word line switch transistors 450 in each of the unselected blocks. Note that at this time $V_{SS}$ may be provided to all of the word line switch transistors 450 in each of the selected blocks. Referring to FIG. 4B, $V_{UNSELECT}$ may be provided to transistors 450 for all blocks 480 at this time.

In step 1506, $V_{DD}$ is applied to gates of the WL switch transistors 450 in the selected block. However, $V_{SS}$ is maintained for transistors 450 in each of the unselected blocks. Referring to FIG. 4B, $V_{SELECT}$ may be provided to transistors 450 for the selected block 480(n). However, $V_{UNSELECT}$ may be maintained for transistors 450 for all other blocks 480 at this time.

In step 1508, $V_{WL\_ERASE}$ is applied to terminals of WL switch transistors 450. In one embodiment, WL switch transistors 450 for both selected and unselected blocks receive this voltage. A result is that $V_{WL\_ERASE}$ is provided to word lines in blocks selected for erase. However, WL switch transistors 450 connected to word lines in unselected blocks remain off.

In step 1510, one or more erase pulses ($V_{\_ERASE}$) are applied to the array p-well region 492. Note this is not the same p-well as the one that the WL switch transistors 450 are in. An example for the erase pulse is 20V. The negative voltage being applied to the WL p-well region 472 may reduce or prevent punch-through conduction in WL switch transistors associated with unselected blocks. After the erase pulse, a verify operation may be performed. Then, process 1500 may be repeated.

Figure 16:
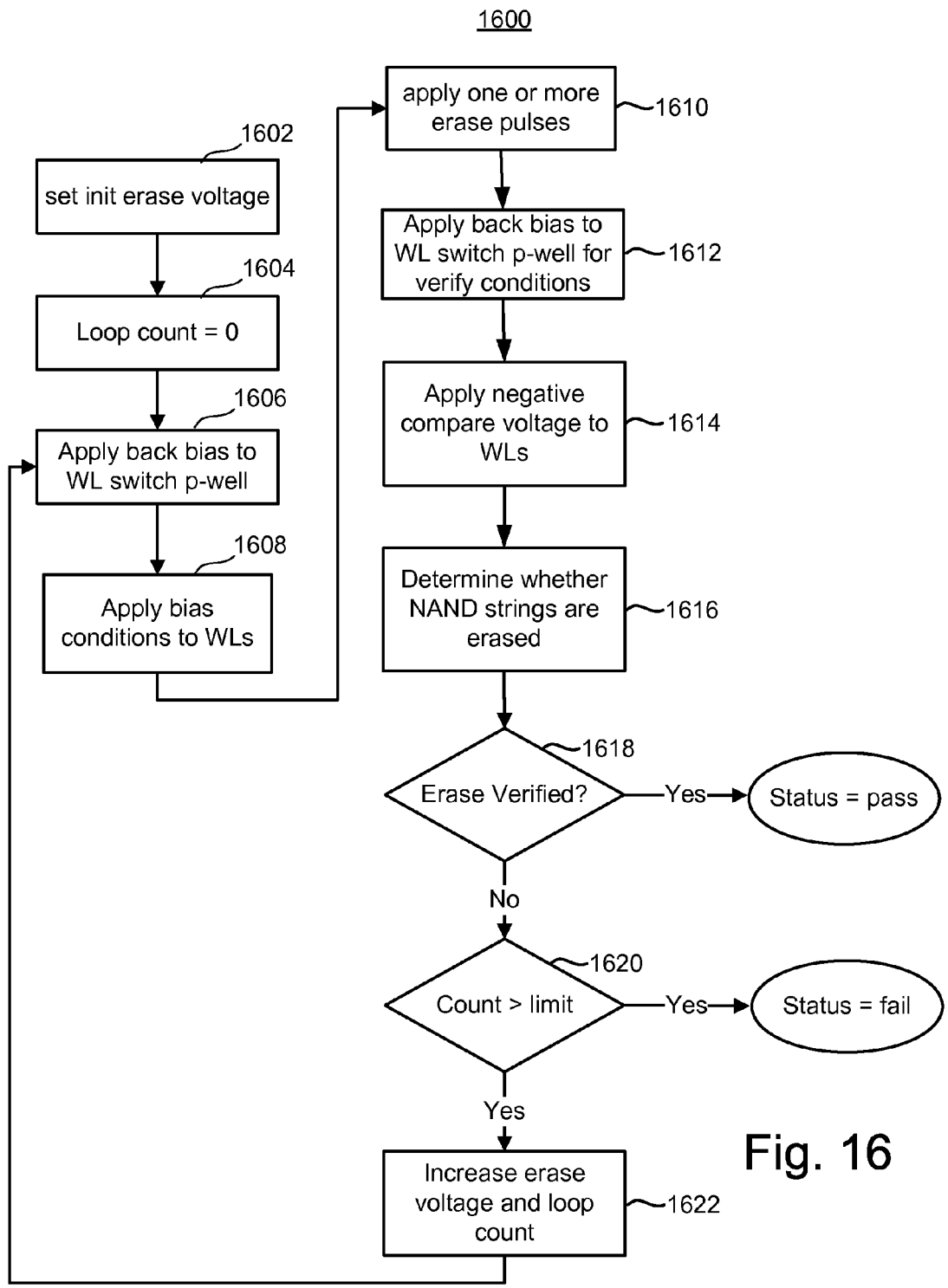
FIG. 16 is a flow chart describing one embodiment of a process for erasing memory cells.

FIG. 16 is a flow chart describing one embodiment of a process 1600 for erasing memory cells. Process 1600 describes how verify operations may be performed between erase operations. In step 1602, the system will set the magnitude of the initial erase pulse. At step 1604, an erase loop count will be set to initially be zero.

In step 1606, the WL switch p-well is back biased. This was discussed with respect to step 1502 of FIG. 15. In step 1608, bias conditions are applied to word lines. This was discussed with respect to step 1508 of FIG. 15.

In step 1610, erase conditions are applied. This is one embodiment of step 1510 of FIG. 15. In one embodiment, step 1610 includes raising the array p-well 492 to an erase voltage (e.g., 20 volts) for a sufficient period of time, maintaining the WL voltages in the selected block, while the source and bit lines are floating. Due to capacitive coupling, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells.

Note that the memory cells in the unselected blocks may be in the same array p-well region 492 as those in the selected block. Therefore, the erase pulse may also be applied to the p-well below memory cells in unselected blocks. However, for these memory cells, the word lines are not maintained at a steady voltage. Instead the WL switch transistors associated with the unselected blocks are off during erase (see, for example, FIG. 14B). Moreover, by applying a negative voltage (e.g., $V_{B\_ERASE}$) to the WL p-well region 472, punch-through conduction may be prevented or eliminated.

In step 1612, a back bias voltage is provided to the WL switch p-well for erase verify conditions. Note that during erase, memory cells may be erased to a negative threshold voltage. Therefore, embodiments that allow for negative read compare voltages may be used during erase verify. In one embodiment, the back bias voltage is somewhat more negative than the negative compare voltage to be used.

In step 1614, a negative compare voltage is applied to the word lines in the selected block. As noted, the back bias voltage to the WL switch p-well 472 allows this negative voltage.

In step 1616, each of the NAND strings is sensed to determine whether the memory cells on the NAND string were sufficiently erased. In one embodiment, if it is detected that the Vt of each memory cell on a NAND string has reached the target level, then the data stored in the corresponding data latch is changed to a logic "1." If it is detected that the NAND string has at least one memory cell with a Vt that has not reached the appropriate target level, the data stored in the corresponding data latch is not changed.

In step 1618, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then the erase status is set to pass and process 1600 ends.

If, at step 1620, it is determined that erase verification failed, then the loop count is checked (step 1620) to determine whether it is over a limit. If so, the erase status is set to fail and process 1600 ends. If the loop count is not over the limit, then the erase voltage is increased in step 1622. The erase voltage can be increased by any desired amount such as 0.2 V, 0.5 V, 1.0 V, etc. The loop count is incremented.

The WL switch p-well 472 is back biased to the erase conditions, in step 1606. Then, bias conditions are set to the WLs, in step 1608. Then, the next erase pulse is performed in step 1610.

Note that some processes such as processes 1100, 1200, 1300, and 1500 were discussed with respect to applying a negative bias to a p-well region. It will be understood that a p-well is one example of a region that can be used for back-biasing. However, the negative bias may be applied to another region of the substrate 490 to back bias the WL switch transistors.

In some embodiments, the Vt of the WL switch transistor 450 is controlled by suitable use of a channel implant. In one embodiment, the channel dose of the WL switch transistor 450 is controlled by use of an additional mask and channel implant step. This allows the channel dose to be controlled independently from other transistors in the periphery. In one embodiment, the WL switch transistor 450 is a low Vt transistor. This may allow avoidance of additional mask and implant steps to control the Vt.

One embodiment includes a method of operating non-volatile storage that may include the following. A negative voltage is applied to a substrate. A first voltage is applied to a first terminal of a WL switch transistor that is formed on the substrate. The WL switch transistor has a second terminal coupled to a word line of a NAND memory array. A select voltage is applied to the WL switch transistor while applying the first voltage and the negative voltage. The first voltage is passed to the word line. In one embodiment, the negative voltage is applied to a well in the substrate.

One embodiment includes a non-volatile storage device, comprising a substrate, a NAND memory array having a plurality of word lines, a plurality of word line switch transistors formed over the substrate, and one or more management circuits in communication with the plurality of word line switch transistor. Respective ones of the word line switch transistors having a first terminal and a second terminal coupled to respective ones of the plurality of word lines. The one or more management circuits apply a negative voltage to a portion of the substrate below the first word line switch transistor. The one or more management circuits apply a first voltage to the first terminal of a first of the word line switch transistors that is coupled to a first of the word lines. The one or more management circuits apply a select voltage to the first WL switch transistor while applying the first voltage and the negative voltage. The first voltage is passed to the first word line. In one embodiment, the substrate has a well that is below to the plurality of word line switch transistors. The one or more management circuits apply the negative voltage to the well, in one embodiment.

One embodiment includes a method of operating non-volatile storage that includes the following. A first well in a substrate is biased to a negative voltage. A program voltage is applied to a first terminal of a WL switch transistor that is coupled to a word line in a memory array having a plurality of NAND strings. The WL switch transistor is over the first well in the substrate. The NAND strings are over a second well in a substrate. A select voltage is applied to the WL switch transistor while applying the program voltage and while biasing the first well to the negative voltage, the program voltage is passed to the word line.

One embodiment includes a non-volatile storage device, comprising a substrate, a first well in the substrate, a second well in the substrate, and a memory array having a plurality of NAND strings formed over the first well. The non-volatile storage device further includes a plurality of word lines associated with the plurality of NAND strings, and a plurality of word line switch transistors over the second well. Respective ones of the word line switch transistors have a first terminal, a second terminal coupled to respective ones of the plurality of word lines, and a gate. The non-volatile storage device further includes one or more management circuits in communication with the plurality of word line switch transistors. The one or more management circuits bias the second well to a negative voltage. The one or more management circuits apply a program voltage to the first terminal of a first of the word line switch transistors that is coupled to a first of the word lines. The one or more management circuits apply a select voltage to the gate of the first WL switch transistor while applying the first voltage and while biasing the second well. The program voltage is passed to the first word line.

One embodiment includes a method of operating non-volatile storage that includes the following. A first well in a substrate is biased to a negative voltage. A negative read compare voltage is applied to a first terminal of a WL switch transistor that is coupled to a word line in a memory array. The WL switch transistor is over the first well in the substrate. The memory array is over a second well in a substrate. The memory array has a plurality of NAND strings formed over the second well. The negative read compare voltage is more positive than the negative voltage to which the first well is biased. A select voltage is applied to a gate of the WL switch transistor while applying the negative read compare voltage and while biasing the first well. The negative read compare voltage is passed to the word line.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical application, to thereby enable others skilled in the art to best utilize the various embodiments and with various modifications as are suited to the particular use contemplated. It is intended that the scope be defined by the claims appended hereto.

What is claimed is:

1. A method of operating non-volatile storage, comprising:
   applying an erase voltage to a first well in a substrate, wherein a NAND memory array resides on the first well, the NAND memory array including a plurality of blocks of non-volatile storage elements;
   applying a negative voltage to a second well in the substrate while applying the erase voltage, wherein a first word line (WL) switch transistor and a second WL switch transistor reside on the second well;
   applying a first voltage to a first terminal of the first word line (WL) switch transistor while applying the erase voltage, the first WL switch transistor having a second terminal coupled to a first word line in a selected block of the NAND memory array;
   applying a select voltage to the first WL switch transistor while applying the first voltage, the erase voltage, and the negative voltage, wherein the first voltage is passed to the first word line;
   applying the first voltage to a first terminal of the second WL switch transistor while applying the erase voltage, the second WL switch transistor having a second terminal coupled to a second word line in an unselected block in the memory array; and
   applying an unselect voltage to the second word line switch transistor while applying the first voltage, the erase voltage and the negative voltage, wherein the first voltage is not passed to the second word line.

2. The method of claim 1, further comprising:
   applying a program voltage to the first terminal of the first word line switch transistor while applying a negative voltage to the second well.

3. The method of claim 1, wherein the negative voltage is between approximately −0.05 to −1.2 volts.

4. The method of claim 1, further comprising:
   applying a negative read compare voltage to the first terminal of the first WL switch transistor while applying a negative voltage to the second well.

5. The method of claim 4, wherein the applying a negative voltage to the second well while applying the negative read compare voltage includes:
   applying a voltage to the second well that is more negative than the negative read compare voltage.

6. The method of claim 1, wherein the threshold voltage of the first WL switch transistor is negative with a second well bias of zero volts.

7. A non-volatile storage device, comprising:
   a substrate;
   a NAND memory array having a plurality of word lines, the memory array formed in a first well in the substrate, the memory array having a plurality of blocks of non-volatile storage elements;
   a plurality of word line switch transistors formed over a second well in the substrate, respective ones of the word line switch transistors having a first terminal and a second terminal coupled to respective ones of the plurality of word lines; and
   one or more management circuits in communication with the memory array and the plurality of word line switch transistors, the one or more management circuits configured to apply an erase voltage to the first well, the one or more management circuits configured to apply a negative voltage to the second well while applying the erase voltage, the one or more management circuits configured to apply a first voltage to the first terminal of a first of the word line switch transistors that is coupled to a first word line that is in a first of the blocks that is selected for erase and to a second of the word line switch transistors that is coupled to a second word line that is in a second of the blocks that is not selected for erase, the one or more management circuits configured to apply a select voltage to the first WL switch transistor and an unselect voltage to the second WL switch transistor while applying the first voltage, the erase voltage, and the negative voltage, wherein the first voltage is passed from the first WL switch transistor to the first word line, and the first voltage is not passed from the second WL switch transistor to the second word line.

8. The non-volatile storage device of claim 7, wherein the one or more management circuits are further configured to apply a program voltage to the first WL select transistor while applying a negative voltage to the second well.

9. The non-volatile storage device of claim 8, wherein the negative voltage is between approximately −0.05 to −1.2 volts.

10. The non-volatile storage device of claim 7, wherein the one or more management circuits are further configured to apply a negative read compare voltage to the first WL select transistor while applying a negative voltage to the second well, the negative voltage that is applied while applying the negative read compare voltage is more negative than the negative read compare voltage.

11. The non-volatile storage device of claim 7, wherein the threshold voltage of the first WL switch transistor is negative with a second well bias of zero volts.

* * * * *